United States Patent
Ide et al.

(10) Patent No.: US 8,400,777 B2
(45) Date of Patent: Mar. 19, 2013

(54) ELECTRONIC MEMBER, ELECTRONIC PART AND MANUFACTURING METHOD THEREFOR

(75) Inventors: Eiichi Ide, Hitachi (JP); Toshiaki Morita, Hitachi (JP); Yusuke Yasuda, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 472 days.

(21) Appl. No.: 12/696,590

(22) Filed: Jan. 29, 2010

(65) Prior Publication Data

US 2010/0195292 A1    Aug. 5, 2010

(30) Foreign Application Priority Data

Jan. 30, 2009   (JP) ................. 2009-018959

(51) Int. Cl.
*H05K 7/10* (2006.01)
(52) U.S. Cl. ......... 361/767; 361/779; 361/783; 174/259
(58) Field of Classification Search .......... 361/760, 361/767, 779, 783; 174/250, 256, 259, 126.1, 174/126.2

See application file for complete search history.

(56) References Cited

U.S. PATENT DOCUMENTS

| | | | | |
|---|---|---|---|---|
| 3,954,459 | A | * | 5/1976 | Schreiner et al. ............ 419/21 |
| 5,514,838 | A | * | 5/1996 | Wen et al. .................. 174/257 |
| 5,607,522 | A | * | 3/1997 | McDonnell ................ 148/281 |
| 6,573,608 | B2 | * | 6/2003 | Kuwahara et al. .......... 257/777 |
| 7,800,209 | B2 | * | 9/2010 | Kozaka et al. ............. 257/682 |
| 2002/0197530 | A1 | * | 12/2002 | Tani et al. ............... 429/218.2 |
| 2005/0028896 | A1 | * | 2/2005 | Uemura et al. ............. 148/431 |
| 2005/0050990 | A1 | * | 3/2005 | Harigae et al. ............. 75/236 |
| 2008/0048561 | A1 | * | 2/2008 | Cheng et al. ............... 313/504 |
| 2008/0156398 | A1 | * | 7/2008 | Yasuda et al. .............. 148/23 |
| 2008/0160183 | A1 | * | 7/2008 | Ide et al. ................. 427/126.5 |
| 2009/0096100 | A1 | * | 4/2009 | Kajiwara et al. ........... 257/741 |

(Continued)

FOREIGN PATENT DOCUMENTS

| | | |
|---|---|---|
| JP | 05-190726 | 7/1993 |
| JP | 2003-309352 | 10/2003 |

(Continued)

OTHER PUBLICATIONS

Toshiaki Morita, et al.; Study of Bonding Technology Using Silver Oxide Particles., 14th Symposium on "Microjoining and Assembly Technology in Electronics"; Feb. 5-6, 2008, pp. 185-190.

Toshiaki Morita, et al.; Bonding Technique Using Micro-Scaled Silver-Oxide Particles for In-Situ Formation of Silver Nanoparticles; Materials Transactions, 2008, pp. 2875-2880; vol. 49, No. 12.

(Continued)

*Primary Examiner* — Hoa C Nguyen
(74) *Attorney, Agent, or Firm* — Antonelli, Terry, Stout & Kraus, LLP.

(57) ABSTRACT

When silver oxide is reduced to silver, a large number of cores of metallic silver are formed inside the silver oxide. Then, the silver oxide is reduced in a manner of being hollowed out while its original outer configuration is being maintained. As a result, the curvature of the silver generated becomes larger. The utilization of this microscopic-particle implementation mechanism allows accomplishment of the bonding even if the silver oxide is supplied not in a particle-like configuration, but in a closely-packed layer-like configuration. In the present invention, there is provided an electronic member including an electrode for inputting/outputting an electrical signal, or a connection terminal for establishing a connection with the electrical signal, wherein the uppermost surface of the electrode or the connection terminal is a silver-oxide layer.

6 Claims, 12 Drawing Sheets

U.S. PATENT DOCUMENTS

2009/0266580 A1 * 10/2009 Jung et al. .................. 174/126.2
2010/0187563 A1    7/2010 Kuramoto et al.

FOREIGN PATENT DOCUMENTS

| JP | 2007-335517 | 12/2007 |
| JP | 4090778 | 3/2008 |
| JP | 2008-208442 | 9/2008 |
| WO | WO 2010/084742 | 7/2010 |

OTHER PUBLICATIONS

JP Office of Appln. No. 2009-018959 Action dated Mar. 13, 2012 with partial English translation.
JP Search Report of Appln. No. 2009-018959 dated Jun. 12, 2012 with partial English translation.

* cited by examiner

ELECTRONIC MEMBER, ELECTRONIC PART AND MANUFACTURING METHOD THEREFOR

BACKGROUND OF THE INVENTION

The present invention relates to electronic members designed on a premise that mutual electrical bonding of the electronic members (e.g., bonding of a semiconductor element and a circuit member) is performed. More particularly, it relates to an electronic part constituted by implementing the electronic members, and its implementation method. Hereinafter, such components as semiconductor elements and circuit members will be generically referred to as "electronic members".

In recent years, there has been a significant increase in the request for the multi-function implementation, high-speed implementation, and light-thin-&-short-small implementation of electronic appliances which start with mobile appliances. What has become important in order to satisfy this request is the narrow-pitch implementation and low-back implementation of the electrode of an electronic appliance for inputting/outputting an electrical signal concerned.

Meanwhile, as is the case with the high-density implementation of an electronic appliance, an enhancement in the heat-liberation property becomes important. This is because there occurs an increase in the heat-liberation amount per unit area and volume. Also, simultaneously, the low-resistance implementation of the bonding portion becomes important in accompaniment with the decrease in the electrode's area.

As the bonding technologies for electrically bonding electrodes to each other among a plurality of electronic members, there are the ones such as electrically-conductive adhesive agent, soldering-used bonding, and metal's press bonding (i.e., bonding of gold bump or the like). Moreover, in contrast to these conventional bonding technologies, the following bonding technology is reported: Namely, in this technology, the use of silver-oxide particles makes it possible to embody a bonding portion having the heat-liberation and heat-resistant characteristics which are superior to those of the soldering and silver paste (refer to, e.g., "14th Symposium on Microjoining and Assembly Technology in Electronics", Preprint Manuscript Collection, p. 185).

The bonding technology where the silver-oxide particles are used is the technology for reducing the silver-oxide particles to silver at a low temperature, thereby causing the bonding portion to be constituted with the low-resistance and high heat-liberation silver. What is used as its bonding material is a composition substance produced by mixing the silver-oxide particles with a reducing agent which allows the silver-oxide particles to be reduced at the low temperature. Also, the composition substance to be used is classified into a bonder-containing composition substance (JP-A-2003-309352) and a no-bonder-containing composition substance (JP-A-2007-335517). In particular, in the latter case where no-bonder-containing composition substance is used as the bonding material, a metallic bond can be obtained with respect to a partner electrode with which the bonding is to be performed ("14th Symposium on Microjoining and Assembly Technology in Electronics", Preprint Manuscript Collection, p. 185). This metallic bond makes it possible to provide the bonding portion which has the excellent heat-liberation property.

Applying heat to the composition substance composed of the silver-oxide particles and the reducing agent results in the generation of silver particles whose particle diameter is small. These small-particle-diameter silver particles exhibit an excellent sintering capability even at the low temperature. Namely, organic components contained in the composition substance are decomposed by the heat-applying processing. This decomposition allows accomplishment of the sintering between the bonding of the generated silver particles and the electrode of an electronic part to be connected and the silver particles. Finally, the organic components are eliminated, which produces and completes the electronic part which has a bonding layer constituted with a metallic-silver network. The bonding layer constituted with the metallic silver results in implementation of the bonding layer which has the excellent heat-liberation characteristics. The heating temperature needed for the bonding is substantially equal to the one needed for the soldering materials widely used in the electronics implementations. Accordingly, attention has been focused on the silver-oxide particles as an electronic-part-use bonding material which is capable of the high heat-liberation. It is assumed, however, that the accomplishment of the satisfying-enough bonding state requires not only the heat-applying step to the bonding material, but also a pressure-applying step thereto.

Concerning the supply of the particle-like silver-oxide bonding material described above, the following techniques have been proposed: Namely, the supply should be performed in accordance with the following techniques with an addition of a reducing agent for reducing the silver oxide to silver at a low temperature.

1) technique whereby various solvents for viscosity adjustment are added to the bonding material, and the printing is performed in the resultant paste state.

2) technique whereby the bonding material is coated on a plate material in the paste state, and the resultant plate material is inserted.

3) technique whereby a reducing agent which will not fall into a liquid state at room temperature is selected, and a pressure is applied to the solid powder to insert the resultant sheet-shaped powder.

SUMMARY OF THE INVENTION

In the bonding where the silver-oxide particles are used, the silver particles whose particle diameter is small are generated when the silver-oxide particles are reduced. The generation of these small-particle-diameter silver particles allows implementation of the bonding at a low temperature and with a low pressure. This is because the decrease in the particle diameter of the metallic particles increases curvature of the metallic particles, and thereby enhances their sintering capability. As a result, the bonding technology where this phenomenon is utilized has been invented. The sintering of the metallic particles is accomplished in such a manner that a surface tension applies to a neck portion between the particles, and that the neck grows accordingly. Namely, the use of the large-curvature particles increases the surface tension as compared with the one in the bulk state, thereby allowing the implementation of the electrical bonding at the low temperature and with the low pressure. The present inventor et al., however, has made experiments in a concentrated manner with respect to the bonding technology where the particle-like silver-oxide particles are used. As a result of the experiments, it has been found out that the following problems exist.

In order to supply the particle-like composition substance with a microscopic pitch, the technique is employed whereby the printing is performed such that the composition substance is formed into the pasted state. Accordingly, performing the printing with a high accuracy has required that the fluidity be raised. There has occurred a problem, however, that the organic-substance amount to be added into the composition substance increases. This problem has prevented the silver-oxide particles from being supplied in a closely-packed manner, thereby resulting in the occurrence of a bonding failure. Also, in the bonding where the silver-oxide particles are used, unlike the bonding where the solder is used, the material will not melt. As a result, there exists a problem that, if a void exists before the bonding, this void is likely to remain as the void as it is after the bonding as well. In the bonding where the silver-oxide particles are used, a condition that the close-packing degree of a sintered-silver layer is high is necessary for implementing the excellent heat-liberation property and mechanical characteristics. Here, the sintered-silver layer becomes the bonding layer after the bonding.

Also, in order to perform the printing with a high accuracy, a technique has been considered and examined whereby the particle diameter of the silver-oxide particles is decreased to enhance their dispersion property into an organic solvent. There has occurred a problem, however, that an aggregation among the silver-oxide particles appears unless the silver-oxide particles are coated with an organic substance after the synthesis. In view of this problem, based on the technique disclosed in, e.g., JP Patent No. 4090778, the surface of the silver-oxide particles is coated with the organic substance for preventing this aggregation. It has turned out, however, that the surface is coated with the organic substance which is unlikely to volatilize. As a result, there has occurred a problem that, when the silver-oxide particles are used as the bonding material, the temperature for eliminating the organic substance rises, and that the bonding temperature rises accordingly. In this way, it has been found out that, in the printing of the pasted material, the supply of the pasted material with the microscopic pitch is difficult, and that the bonding with a high reliability is impossible.

Next, Au bumps of a LSI chip arranged with the microscopic pitch are dip-coated with the pasted material. Moreover, the dip-coated Au bumps are set up on a printed board which has a solder resist between the connection terminals. No problem has arisen at this set-up step. Nevertheless, as a result of a pressure application at the time of the bonding, there has occurred a spread of the bonding material which is found to exceed the resist's range. This is because the pasted material has a high fluidity. After the bonding, this spread of the bonding material has resulted in the occurrence of a short-circuit between electrodes.

Also, a dry processing has been performed before the bonding, thereby preventing the spread of the bonding material caused by the pressure application. It has turned out, however, that the bonding layer in the region coated on side surfaces of the bumps becomes the bonding layer implemented with no pressure applied thereon. Consequently, it has been found unsuccessful to ensure the bonding strength for the Au bumps. As a consequence, there has occurred an exfoliation of the bonding layer after the bonding, and there has appeared a short-circuit location with an adjacent electrode due to the bonding layer exfoliated.

The present invention has been devised in view of the problems as described above. Accordingly, an object of the present invention is to supply the bonding material with a microscopic pitch, and thereby to provide electronic members whose electrical connection is implementable.

Taking advantage of a transmission microscope, the present inventor et al. has investigated the behavior in which the silver oxide is reduced to the silver. As a consequence, the inventor et al. has confirmed that, even if the curvature of the silver oxide before the reduction is of a small layer-like configuration, the curvature of the silver generated after the reduction becomes larger as well. The inventor et al. has found out that this phenomenon is attributed to the following microscopic-particle implementation mechanism for the silver oxide: Namely, the phenomenon that the silver oxide is reduced to the silver, and that the volume of the silver oxide is decreased accordingly is not caused to occur such that, as illustrated in FIG. 1A, the silver oxide is contracted in a geometrically-similar manner, but is caused to occur such that, as illustrated in FIG. 1B, a large number of cores of the metallic silver are formed inside the silver oxide, and that the silver oxide is reduced in a manner of being hollowed out while its original outer configuration is being maintained.

The inventor et al. has estimated that the utilization of this microscopic-particle implementation mechanism allows accomplishment of the bonding even if the silver oxide is supplied not in the particle-like configuration, but in the closely-packed layer-like configuration. As a result of concentrated experiments, the inventor et al. has confirmed that the use of the silver oxide formed into the layer-like configuration allows implementation of the bonding without fail. In this way, it has been found out that the bonding using the silver oxide formed into the layer-like configuration makes it possible to solve the problems arising from the pasted-state formation of the silver oxide.

In this way, in order to accomplish the above-described object, the present invention provides an electronic member, including an electrode for inputting/outputting an electrical signal, or a connection terminal for establishing a connection with the electrical signal, wherein the uppermost surface of the electrode or the connection terminal is a silver-oxide layer.

The above-described electronic member can be manufactured by a method of manufacturing an electronic member, including the steps of forming a silver layer on the uppermost surface of the electrode or the connection terminal, and further, forming the entire or a partial silver layer of the silver layer into a silver-oxide layer by applying an oxidization processing to the silver layer.

Also, the present invention provides a method of implementing an electronic part, including a step of establishing an electrical bonding between the electrodes by supplying a reducing agent to the silver-oxide layer of the electronic member, and imparting at least a 100-° C. to 400-° C. heat application to the bonding surface, and imparting at least a 0.1-MPa to 20-MPa pressure application to the bonding surface when the silver oxide is reduced to metallic silver.

The above-described technique makes it possible to provide an electronic part, including one or more connection terminals set up in a circuit board, and one or more electrode terminals set up in an electronic member, wherein the one or more electrode terminals are electrically bonded to the one or more connection terminals via a bonding layer, the bonding layer being mainly composed of sintered silver whose crystalline particle diameter is equal to 1000 nm or less, the entire surface or a partial surface of the electrode surface other than the bonding layer being a coarsely-grained layer of metallic silver.

The present invention employs the technique whereby the entire Ag-metalized layer or a partial Ag-metalized layer is oxidized into the silver-oxide layer. On account of this feature, a pitch spacing with which the Ag-metalized electrode can be formed becomes the pitch spacing with which the bonding is made implementable by the present invention. Namely, the electronic member becomes a one in which there scarcely occurs a decrease in the pitch spacing caused by the supply method for the bonding material. In this way, according to the present invention, it becomes possible to supply, with a microscopic pitch and in a thin manner, the bonding portion in which the high heat-liberation and high heat-resistant silver oxide is used. This feature allows the high-density implementation with a high accuracy.

Other objects, features and advantages of the invention will become apparent from the following description of the embodiments of the invention taken in conjunction with the accompanying drawings.

DETAILED DESCRIPTION OF THE INVENTION

Figure 1A:
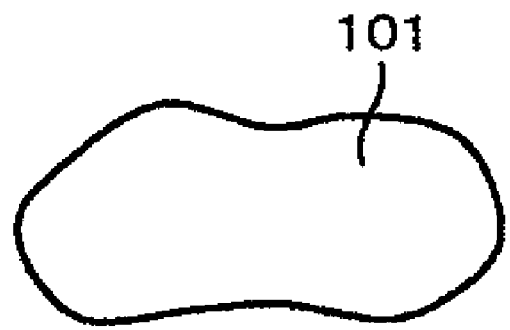
FIG. 1A and FIG. 1B are the cross-sectional schematic diagrams for illustrating the behavior in which the silver oxide is reduced to generate the silver particles.
Figure 1B:
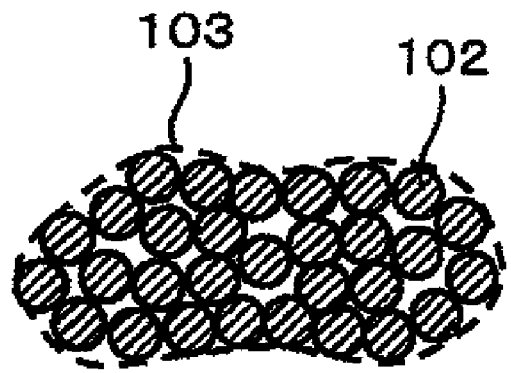
Figure 2A:
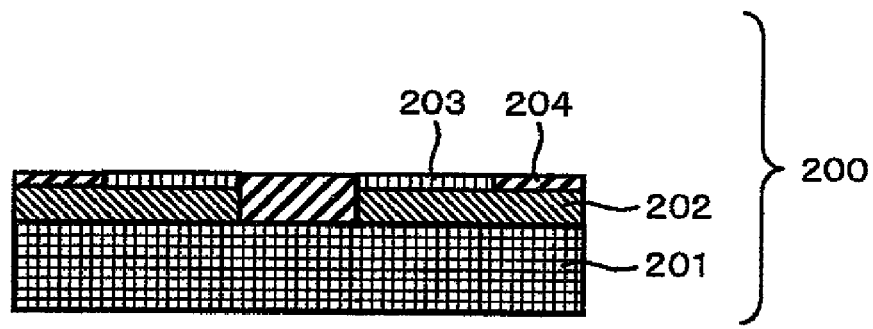
FIG. 2A to FIG. 2C are schematic diagrams for illustrating an embodiment according to the present invention, i.e., an electronic member including a silver-oxide layer on its electrode surface, an electronic part using this electronic member, and its manufacturing method.

Hereinafter, referring to FIG. 2A to FIG. 2C, the explanation will be given below concerning an embodiment of the present invention. FIG. 2A illustrates the following circuit board 200: In this circuit board 200, a wiring 202 is formed on a board insulating layer 201. Next, an electrode 203 is formed at a portion which becomes a connection terminal (electrode) of the wiring 202. Moreover, a resist 204 is provided on the periphery of the connection terminal.

(1) The electrode 203 of the electronic member is formed into an Ag-metalized layer, or further, the Ag-metalized layer is provided on the uppermost surface of the electrode 203.

(2) Next, the entire Ag-metalized layer or a partial Ag-metalized layer is oxidized into a silver-oxide layer. In the latter case, the layer other than the partial Ag-metalized layer is left as it is, and remains unchanged.

Figure 2B:
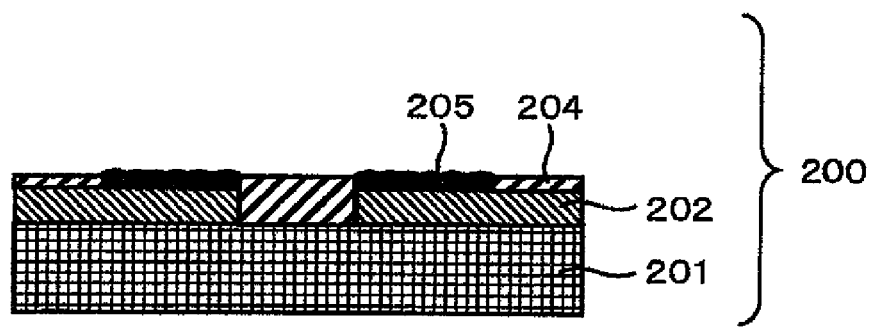

It has been found out that, as illustrated in FIG. 2B, the execution of the processings (1) and (2) makes it possible to provide the silver-oxide layer 205 (which becomes the bonding material) with a high density. This is made possible because the reaction mechanism accompanied by the volume expansion is assumed when the Ag-metalized layer is oxidized into the silver-oxide layer.

An LSI chip 209 (i.e., chip 206, electrode 207, and metalized layer 208) is bonded onto the circuit board 200 illustrated in FIG. 2B, using the implementing method described earlier. This bonding makes it possible to provide an electronic part in which a sintered-silver layer 205a illustrated in FIG. 2C is provided in the bonding portion. Also, a sintered-silver layer 205b, to which no pressure application is imparted at the time of the bonding, becomes a coarsely-grained layer. In the present invention, the silver-oxide layer, which becomes the bonding material, has no fluidity unlike the pasted material. Moreover, the silver-oxide layer has a constant strength with respect to the base-board metalized layer. Furthermore, unlike the solder material, the silver-oxide layer will not melt. As a result of these features, there occurs none of the spread of the bonding material (electrically-conductive portion) caused by the heat application and pressure application at the time of the bonding. Also, the metallic bond is made implementable with the application of the low pressure, which is equal to 0.1-MPa to 20-MPa per bonding surface. Consequently, it becomes possible to reduce a plasticity deformation in a direction parallel to the bump's bonding surface as compared with the pressure bonding method. In this way, the electronic part becomes an electronic part in which there scarcely occurs the decrease in the pitch spacing at the time of the electronic-member implementation, i.e., the problem in the conventional method.

Hereinafter, the explanation will be given below concerning an invention and improved points in which these characteristics are utilized.

Supplying the silver oxide not in the particle-like configuration, but in the layer-like configuration makes it possible to impart a constant strength to the supplied surface. In this way, by imparting the strength between the bonding material and the base board before the bonding, it becomes possible to implement impulse-resistant property and to prevent dispersion of the bonding material at the time of the bonding. Also, after the oxidization processing from the Ag-metalized layer to the silver-oxide layer, the layer other than the partial Ag-metalized layer is left as it is and remains unchanged. Namely, the base board of the silver-oxide layer is formed into the Ag-metalized layer. This remaining Ag-metalized layer makes it possible to impart a 5-MPa-or-more close-bonding force between the silver-oxide layer and the base board.

Figure 2C:
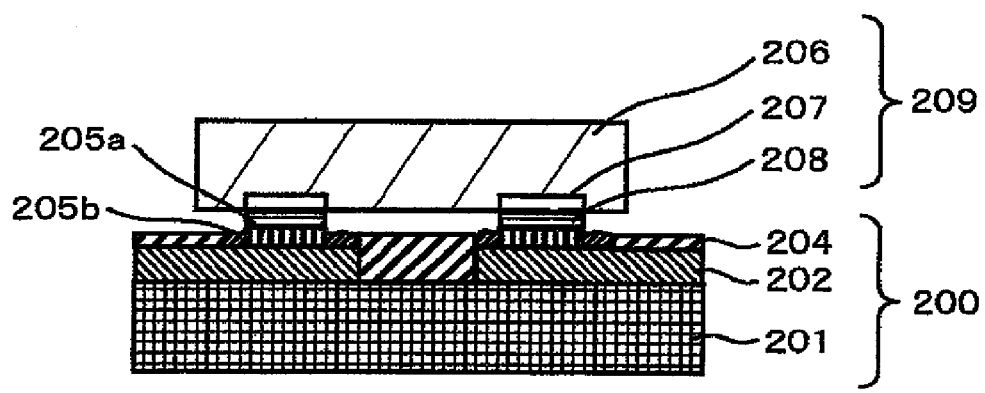

Moreover, performing the bonding in the above-described state results in the integration (i.e., metallic bond) with the Ag-metalized layer of the base board even in the no-pressure-application state (i.e., the region 205b in FIG. 2C). This metallic bond brings about implementation of the strength of the Ag's bulk state. As a result, the elimination of the bonding region of the no-pressure-application portion (i.e., the region 205b in FIG. 2C) becomes unnecessary. Incidentally, this elimination becomes the problem when the particle-like silver oxide is used. This consequence leads to the material's supply area which can be made wider than the bonding area, thereby allowing implementation of the more stable bonding.

In the bonding where the silver oxide is used, the bonding is performed by the sintering of the silver particles which are generated when the silver oxide is reduced. When the silver oxide is reduced to the metallic silver, however, the decrease in the volume occurs. On account of this decrease in the volume, as the film thickness of the silver-oxide layer becomes thicker, imparting the pressure application at the time of the bonding compresses the silver-oxide layer further in a direction perpendicular to the bonding surface, and makes the silver-oxide layer more closely-packed. Although the detailed explanation will be given below in a third embodiment, a sharp strength rise has been recognized if the film thickness of the silver-oxide layer exceeds about 400 nm. Accordingly, it is preferable that the thickness of the silver-oxide layer, which becomes the bonding layer, be larger than 400 nm. If, however, the film thickness becomes larger than 5 μm, the formation of the silver oxide necessitates the lapse of a long time. Simultaneously, the time needed for the reduction at the time of the bonding also becomes longer. This is not a preferable situation. Consequently, it is preferable that the thickness of the silver-oxide layer, which becomes the bonding layer, be smaller than 5 μm.

In association with the electrode surface of the electronic part to be bonded, the sintering of the electrode surface with the silver particles which are generated from the reduction of the small-curvature silver oxide becomes more difficult as compared with the mutual sintering of the silver particles themselves. As described earlier, the silver particles generated from the reduction of the silver oxide reflects the original outer configuration of the silver oxide before being reduced. Accordingly, it is advantageous that the curvature radius of the silver oxide before being reduced be smaller. The curvature radius of the silver oxide is made controllable by the oxidization processing condition. Also, it is preferable that, on the surface of the silver-oxide layer, the curvature radius of the silver particles to be generated be so controlled as to become smaller than 1 μm so that the silver particles generated becomes the particles in nanometer size. Furthermore, when bonding two or more electronic members to each other such that they are overlapped with each other and the pressure application is imparted thereto, the existence of a surface friction resistance makes it possible to suppress the sliding of the members occurring when the pressure application is imparted thereto.

Organic metals (e.g., carboxylic-acid silver salt) function as reducing agents for the silver-oxide layer. Accordingly, supplying a certain organic metal to the silver-oxide layer allows implementation of the bonding where the silver oxide is reduced. The supply of the organic metal may be performed by coating its solution, or by reforming part of the silver oxide. Also, the reduction temperature of the silver oxide implemented by the organic metal becomes equal to 200° C. or less. Consequently, taking advantage of an organic metal, whose melting point is equal to 200° C. or more, results in no formation of the liquid layer at the time of the bonding. This makes it possible to prevent large-sized voids from being produced inside the bonding layer.

In much the same way as in the above-described description, materials which function as the reducing agents for the silver-oxide layer also include organic substances. It is preferable that the type of the organic substances be one kind or more organic substances selected from carboxylic-acid species, alcohol species, and amine species. Incidentally, it is assumed that "species" includes substances such as ions and complexes originating from the case where an organic substance is chemically bonded to a metal. Also, "species" includes an organic substance with which a metallic particle whose particle diameter is of nanometer size is coated. It is desirable, however, to avoid an organic substance containing sulfur or halogen elements. This is because there is a possibility that the element remains inside the bonding layer after the bonding, and becomes the cause for corrosion.

Examples which are mentionable as the carboxylic-acid species are as follows: Acetic acid, caproic acid, enanthic acid, caprylic acid, pelargonic acid, capric acid, undecanoic acid, lauric acid, tridecyl acid, myristic acid, pentadecyl acid, palmitic acid, margaric acid, stearic acid, myristleic acid, palmitoleic acid, oleic acid, elaidic acid, erucic nerbonic acid, linoleic acid, linolenic acid, arachidonic acid, eicosoic pentanoic acid, sardine acid, oxalic acid, malonic acid, maleic acid, fumaric acid, succinic acid, glutaric acid, malic acid, adipic acid, citric acid, benzoic acid, phthalic acid, isophthalic acid, terephthalic acid, salicylic acid, 2,4-hexadiyne carboxylic acid, 2,4-heptadiyne carboxylic acid, 2,4-octadiyne carboxylic acid, 2,4-decadiyne carboxylic acid, 2,4-dodecadiyne carboxylic acid, 2,4-tetradodecadiyne carboxylic acid, 2,4-heptadecadiyne carboxylic acid, 2,4-hexadecadiyne carboxylic acid, 2,4-octadecadiyne carboxylic acid, 2,4-hexadecadiyne carboxylic acid, 2,4-octadecadiyne carboxylic acid, 2,4-nonadecadiyne carboxylic acid, 10,12-tetradecadiyne carboxylic acid, 10,12-pentadecadiyne carboxylic acid, 10,12-hexadecadiyne carboxylic acid, 10,12-heptadecadiyne carboxylic acid, 10,12-octadecadiyne carboxylic acid, 10,12-tricosadiyne carboxylic acid, 10,12-pentacosadiyne carboxylic acid, 10,12-hexacosadiyne carboxylic acid, 10,12-heptacosadiyne carboxylic acid, 10,12-octacosadiyne carboxylic acid, 10,12-nonacosadiyne carboxylic acid, 2,4-hexadiyne carboxylic acid, 3,5-octadiyne carboxylic acid, 4,6-decadiyne carboxylic acid, and 8,10-octadecadiyne carboxylic acid.

Examples which are mentionable as the alcohol species are as follows: Ethyl alcohol, propyl alcohol, butyl alcohol, amyl alcohol, hexyl alcohol, heptyl alcohol, octyl alcohol, nonyl alcohol, decyl alcohol, undecyl alcohol, dodecyl alcohol, myristyl alcohol, cetyl alcohol, stearyl alcohol, oereyl alcohol, linoryl alcohol, ethylene glycol, triethylene glycol, and glyceric acid.

Examples which are mentionable as the amine species are as follows: Methylamine, ethylamine, propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, oreylamine, dimethylamine, diethylamine, diropylamine, dibutylamine, diheptylamine, dihexylamine, diheptylamine, dioctylamine, dinonylamine, didecylamine, isopropylamine, 1,5-dimethylhexylamine, 2-ethylhexylamine, di(2-ethylhexyl)amine, methylenediamine, trimethylamine, triethylamine, ethylenediamine, tetramethylethylenediamine, hexamethylenediamine, N,N-dimethylpropane-2-amine, aniline, N,N-diisopropylethylamine, 2,4-hexadiinylamine, 2,4-heptadiinylamine, 2,4-octadiinylamine, 2,4-decadiinylamine, 2,4-dodecadiinylamine, 2,4-tetradecadiinylamine, 2,4-pentadecadiinylamine, 2,4-hexadecadiinylamine, 2,4-octadecadiinylamine, 2,4-nonadecadiinylamine, 10,12-tetradecadiinylamine, 10,12-pentadecadiinylamine, 10,12-hexadecadiinylamine, 10,12-heptadecadiinylamine, 10,12-octadecadiinylamine, 10,12-tricosadiinylamine, 10,12-pentacosadiinylamine, 10,12-hexacosadiinylamine, 10,12-heptacosadiinylamine, 10,12-octacosadiinylamine, 10,12-nonacosadiinylamine, 2,4-hexadiinylamine, 3,5-octadiinylamine, 4,6-decadiinylamine, 8,10-octadecadiinylamine, stearic acid amide, palmitic acid amide, lauric acid lauryl amide, oleic acid amide, oleic acid diethanol amide, and oleic acid lauryl amide.

Consideration is given to the case where each simple substance of the organic substances described above, or a composition substance produced by mixing the organic substances with each other is supplied to the silver-oxide layer as the reducing agent. In this case, if these organic substances are in their liquid states at room temperature, their reduction reaction speeds with the silver-oxide layer increase as compared with the ones in their solid states. Also, the storage of these organic substances becomes difficult to achieve. Accordingly, if these organic substances are not used for the bonding immediately after they are supplied, it is preferable that these organic substances be in their solid states at room temperature. Also, it is preferable that the organic substances possess molecular structures which, when the organic substances react with the silver oxide, make their by-products more likely to decompose at a low temperature.

Although the detailed explanation will be given below in a sixth embodiment, the lowest heat-application temperature needed for the bonding with the bonding material according to the present invention is equal to 100° C. This temperature is exceedingly lower as compared with the one needed for the bonding with the solder material. This characteristic makes it possible to introduce, into the electronic part, such substances as polyethylene terephthalate and polyethylene, which have been unusable from the viewpoint of their heat-resistant property in the bonding where the solder is used. Also, the Ag-metalized layer is provided on the uppermost surface of the electrode using the evaporation or plating technology, then applying the oxidization processing to the Ag-metalized layer to supply the silver-oxide layer. This method makes it possible to supply the silver-oxide layer onto the organic substances and inorganic substances such as ceramics, starting with the metals.

The utilization of this characteristic allows an electronic member to include the silver-oxide layer, which becomes the bonding material of the present invention, on the surface of its electrode or connection terminal. Examples which are mentionable as such an electronic member are as follows: CSP-use TAB, COF carrier tape, lead frame, ceramics wiring board, organic wiring board, LSI chip, or semiconductor package.

The present invention is applicable to the flip-implementation-use electronic member. As described earlier, the present invention makes the metallic bond implementable with the application of the low pressure, which is equal to 0.1-MPa to 20-MPa per bonding surface. Consequently, it becomes possible to achieve the low pressure-application accomplishment in the flip-chip implementation. This feature allows a reduction in the deformation of the wiring or the like.

In the flip-chip implementation technology, in some cases, the following technique is employed: As a countermeasure against the decrease in the bonding area due to the microscopic-pitch bonding, a void between the bonded members is filled with a resin, thereby reinforcing the strength of the entire bonding portion. In the conventional paste-like bonding material, however, there exists the fluidity. Accordingly, there has been a problem that setting up the resin in advance turns out to be unsuccessful in executing the flip-chip implementation. Consequently, the case of accomplishing the resin-filled structure requires that the void be filled with the resin after the members have been bonded to each other. In contrast thereto, the bonding material of the present invention is integrated with the electrode. As a result, it becomes possible to execute the flip-chip implementation in the state where the resin has been set up in advance. This feature allows an omission of the processing steps in comparison with the case of the conventional method.

In the flip-chip implementation technology according to the present invention, the following technique is employable: The bumps are formed into the protrusion type, then being inserted into a concave-type electrode. Otherwise, the bumps are pushed to be brought into contact with a plane-like electrode, thereby destructing the oxidized coating film of a bonding-partner electrode. Otherwise, a resin is inserted between the bumps in advance. In the conventional pasted-material coated layer, the pasted-material coated layer is exfoliated by a shearing force at the time of the insertion. As a result, the employment of this technique has turned out to be unsuccessful. In the present invention, however, the formation of the silver oxide into the high-density layer-like configuration allows the enhancement in the close-bonding property between the silver-oxide layer and the base board, which makes this technique employable. Also, the strength between the silver-oxide layer and the base board is solidified at the time of the Ag-metallization, which is preferable. Furthermore, when destructing the oxidized coating film of the bonding-partner electrode, the surface of the protrusion-type bumps is formed into the silver-oxide layer. This processing raises the surface hardness of the bumps, thereby making it possible to destruct the oxidized coating film of the bonding-partner electrode with a lower pressure application as compared with the case where the surface is composed of Cu, Au, Ag, or Al.

An electronic part is manufactured using the bonding member explained so far. This method makes it possible to provide an electronic part as illustrated in, e.g., FIG. 2C, which includes one or more connection terminals set up in a circuit board, and one or more electrode terminals set up in an electronic member, wherein the one or more electrode terminals are electrically bonded to the one or more connection terminals via a bonding layer, the bonding layer being mainly composed of sintered silver whose crystalline particle diameter is equal to 1000 nm or less, the entire surface or a partial surface of the electrode surface other than the bonding layer being a coarsely-grained layer of metallic silver.

The bonding layer is mainly composed of Ag, whose thermal conductivity is the highest of all the metals. This feature makes it possible to ensure the heat-liberation property which becomes necessary in accompaniment with the high-density implementation. Also, the thickness of the bonding layer can be made thin, or the electrical resistivity is low. This allows accomplishment of the high-speed implementation of signals. Moreover, the electrode surface other than the bonding layer is constituted into the coarsely-grained layer as a partial surface of the electrode surface. This makes it unnecessary to eliminate the region (i.e., 205b in FIG. 2C) which becomes the bonding defect in the case of no pressure application. Also, the base board of the coarsely-grained layer is the Ag-metalized layer. This is preferable, since it is capable of increasing the strength more.

In the case of the structure where the void between the bonded members is filled with the resin, the electrode surface which is not equivalent to the bonded region is also formed into the silver oxide. This configuration allows implementation of an increase in the close-bonding strength with the resin, thereby making it possible to enhance the connection reliability. Also, as described earlier, the filling of the resin is executable before the heat application.

Also, fillers such as alumina, aluminum nitride, and silicon nitride which have different thermal expansion coefficients may be mixed into the filled resin. This mixing makes it possible to relax a thermal stress which is caused to occur from a difference in the thermal expansion coefficients between, e.g., a Si chip and a Cu wiring.

As described above, the thermal stress is caused to occur from the difference in the thermal expansion coefficients of the raw materials between, e.g., the Si chip and the Cu wiring. This phenomenon takes place in accompaniment with a temperature rise at the time of manufacturing the electronic part, or in its usage environment. As a countermeasure against this phenomenon, the close-packing degree of the sintered silver, which is the bonding layer, is decreased, then filling the inside of the sintered-silver layer with a resin. This configuration makes it possible to enhance the absorption of the thermal stress further, thereby allowing implementation of a reduction in the stress applied to the Si chip. The close-packing degree of the sintered silver of the bonding layer is made controllable by operations such as a decrease in the pressure application at the time of the bonding. In much the same way as in the above-described explanation, the filling of the resin is executable whichever of before and after the bonding.

The raw material for the electrode or connection terminal, to which the Ag-metallization is to be applied, is selected from a simple substance, an alloy, or a mixture of Ag, Au, Cu, Pt, Ni, Co, Si, Fe, Ti, Mo, and Al. This selection makes it possible to impart the mechanical or chemical characteristics to the bonding portion, starting with the thermal expansion coefficients and the corrosion-resistant property.

Also, the bonding portion according to the present invention is mainly composed of Ag. Accordingly, the melting point of the bonding portion is tremendously higher as compared with the melting point of the solder material. In the currently-used implementation method in the manufacturing process for a semiconductor device, the use of hierarchical solder has become its mainstream. The solder used in the primary implementation is requested to have a melting point which is higher than the implementation temperature (230 to 260° C.) of Sn—Ag—Cu-based solder mainly used in the secondary implementation. On account of this situation, conventionally, high-temperature solder (lead content ratio: about 96%, melting point: about 300° C.) has been used often. Consequently, it is preferable that, from the viewpoint of this melting point, the base board be a simple substance selected from the group of Ag, Au, Cu, Pt, Ni, Co, Si, Fe, Ti, Mo, and Al, its alloy, or its mixture. Here, Ag, Au, Cu, Pt, Ni, Co, Si, Fe, Ti, Mo, and Al are metals whose melting points exceed at least 300° C. even if they are alloyed with Ag. This selection allows lead-free implementation of the high-temperature solder, which is difficult to accomplish in the present situation.

For example, when a package having the semiconductor bonding portion according to the present invention is further implemented onto a circuit board, even if the bonding is achieved using the solder material, its bonding portion will not melt. Also, the solder material is usable for the bonding between the semiconductor package and the circuit board. Moreover, the in-batch bonding is made executable.

As described earlier, the lowest heat-application temperature needed for the bonding with the bonding material according to the present invention is equal to 100° C. This temperature is exceedingly lower as compared with the one needed for the bonding with the solder material. Accordingly, in a case where the heat-resistant property is not requested, and in particular, in a case of the bonding portion where the stress relaxation is necessary, it is advisable that Sn and Sn alloy, or In and In alloy, which have the higher stress relaxation capability as compared with the sintered silver, be included into the configuration of the electrode. Also, in a case where the strength is not requested, but in a case where the heat-resistant property is requested, it is advisable that a high-melting-point inter-metals compound be formed by melting Sn and Sn alloy, or In and In alloy, and causing the melted metals to react with the silver particles generated from the reduction of the silver-oxide layer. At this time, surface area of the silver particles generated from the silver-oxide layer is large. Accordingly, there exists an effect of being capable of shortening the reaction time needed for the formation of the inter-metals compound.

The bumps are included into the configuration of the electrode. This configuration makes it possible to easily control the distance between the electronic part and the circuit board. The bonding is made executable with the lower pressure application as compared with the bonding pressure application by the pressure bonding of the metallic bumps. This feature allows a reduction in deformation of the wiring or the like. Also, the plasticity deformation amount of the bumps in the horizontal direction is reduced. This feature makes it possible to implement the microscopic pitch into a more microscopic pitch.

The bumps are composed of a metal of simple substance or alloy of Al, Sn, Cu, Au, In, and Ag whose hardness is low, a plastic, or a resin. This configuration makes it possible to further decrease the pressure application at the time of the bonding, which is preferable.

The bumps are formed into the protrusion-type bumps composed of a metal of simple substance or alloy of Al, Cu, Au, Ag, and Ni, or ceramics whose hardness is high. This configuration allows the metallic bond to be accomplished with a low pressure application by destructing and bonding the oxidized coating film of the bonding-partner electrode. The hardness of a metal is made changeable by a selection from the heat processing, distortion impartment, and plating liquid.

Also, in the present invention, the bonding material can be supplied with a high accuracy to the bumps of various raw materials and shapes. This feature allows the insulating-property-imparted bonding to be accomplished by applying the evaporation or plating onto a partial portion of the plastic, resin, or ceramics.

One of the electronic parts according to the present invention is a RFID tag. In the RFID tag according to the present invention, there exists an effect of being capable of decreasing the thickness of the bonding portion as compared with in the conventional technologies. Also, it becomes possible to introduce, into the electronic parts, such substances as polyethylene terephthalate and polyethylene, which have been unusable from the viewpoint of their heat-resistant property in the bonding where the solder is used.

Metallic silver before being oxidized into silver oxide can be formed into various shapes by machining, casting, or welding the metallic silver. Also, consideration is given to the fact that the bonding is performed by imparting the pressure application. Namely, the hardness is lowered by applying an annealing after the machining, thereby making it likely that the plasticity deformation will occur at the time of the pressure application in the bonding. This processing enhances the close-bonding degree of the bonded surfaces, thereby increasing the bonding strength.

In association with the foregoing narrow-pitch implementation between the electrode and the terminal of the electronic part, in order to accomplish the even-higher density achievement of the implementation area, proposals have been made regarding three-dimensional implementation technologies such as a build-up wiring board where parts are built-in, lamination of chips within one and the same package, and mutual lamination of packages. In these technologies, in addition to the narrow-pitch implementation, in particular, the low-back implementation of the bonding portion is requested in comparison with the conventional technologies as a countermeasure against the high-speed implementation of signals, and the high-back implementation due to the implementation into the perpendicular direction.

In the bonding material according to the present invention, unlike the pasted material, the supply of an organic substance can be suppressed down to the lowest necessary amount. Consequently, it becomes possible to decrease the amount of gases generated at the time of the bonding. This characteristic allows implementation of the bonding which results in less contamination over peripheral pars due to the generated gases. This characteristic is the optimum characteristic for the above-described three-dimensional implementation.

The application of the present invention makes it possible to provide a multi-layer wiring board, including one or more built-in electronic parts, wherein a bonding layer between electrodes of the electronic parts is constituted with sintered silver, the crystalline particle diameter of the sintered silver being equal to 1000 nm or less, the entire surfaces or partial surfaces of the bonding layer and a resin being bonded to each other via a coarsely-grained layer of metallic silver or silver oxide. This multi-layer wiring board makes it possible to provide the low-back implementation of the bonding portion, and to enhance the close-bonding property with the resin.

Also, the application of the present invention makes it possible to provide a laminated chip, including a plurality of LSI chips which are laminated with each other, wherein electrodes of the LSI chips are electrically bonded to each other via a bonding layer, the bonding layer being mainly composed of sintered silver whose crystalline particle diameter is equal to 1000 nm or less, the entire surface or a partial surface of the electrode surface other than the bonding layer being a coarsely-grained layer of metallic silver.

Hereinafter, the explanation will be given below concerning an embodiment of a method of manufacturing an electronic member or electronic part according to the present invention.

The present invention provides a method of manufacturing an electronic member, including the steps of forming a silver layer on the uppermost surface of an electrode for inputting/outputting an electrical signal or establishing a connection with the electrical signal, and further, forming the entire or a partial silver layer of the silver layer into a silver-oxide layer by applying an oxidization processing to the silver layer. The formation of the silver layer makes it possible to supply the silver-oxide layer, which becomes the bonding material, to conductors, semiconductors, and insulators of various shapes, thereby allowing the conductors, semiconductors, and insulators to be bonded to each other at a low temperature and with a low pressure application.

In the above-described manufacturing method, the silver layer is formed by the casting or welding.

In the above-described manufacturing method, the silver layer is formed by the evaporation or plating.

In the above-described manufacturing method, the silver-oxide layer is formed by the anode oxidization or ozone oxidization.

Consideration is given to a case where the anode oxidization method is applied as the technique for oxidizing the silver layer into the silver-oxide layer. The anode oxidization method makes it possible to control the surface curvature and film thickness of the silver-oxide layer with a high accuracy. In a case of the non-electrolytic anode oxidization method, changing the solution and temperature for the manufacturing allows manufacturing of the target silver-oxide layer. In a case of the electrolytic anode oxidization method, changing the solution, current density, electric potential, and temperature for the manufacturing allows manufacturing of the target silver-oxide layer. The solution is produced using an alkaline aqueous solution such as sodium hydroxide or potassium hydroxide.

When the processing within the liquid is difficult to achieve, the technique can be employed whereby the silver layer is oxidized into the silver-oxide layer using the ozone gas. The ozone oxidization also makes it possible to control the surface curvature and film thickness of the silver-oxide layer with a high accuracy. Namely, changing the temperature and ozone concentration for the manufacturing allows manufacturing of the target silver-oxide layer.

The present invention provides a method of implementing an electronic part, the electronic part, including one or more connection terminals set up in a circuit board, and one or more electrode terminals set up in an electronic member, wherein the one or more electrode terminals are electrically bonded to the one or more connection terminals via a bonding layer, surfaces of at least either of the connection terminals and the electrode terminals being constituted with a silver-oxide layer, the electronic-part implementing method, including a step of establishing an electrical bonding between the connection terminals and the electrode terminals by supplying a reducing agent to the silver-oxide layer, and imparting at least a 100-° C. to 400-° C. heat application to the bonding surface, and imparting at least a 0.1-MPa to 20-MPa pressure application to the bonding surface when the silver oxide is reduced to metallic silver.

In the above-described implementing method, the reducing agent is the alcohol species, the carboxylic-acid species, and the amine species.

In association with the electrodes which can be bonded to the bonding material (i.e., silver-oxide layer) according to the present invention, an appropriate selection of the reducing agent allows accomplishment of the metallic bond with the electrodes. This accomplishment is implementable as long as the metalized layer on the uppermost surface of the electrode of the electronic part is composed of a simple substance or alloy of Au, Ag, Pt, Pd, Cu, and Ni. Also, with respect to a metal whose oxidized coating film is stable, which starts with Al or the like, the bonding is implementable via this oxidized coating film. Also, the mutual bonding of the silver-oxide layers themselves is implementable.

By supplying the reducing agent only to the bonding surface of the electronic member, it becomes possible to leave the electrode surface other than the bonding surface as it is as the silver-oxide layer. This is the following technique: Namely, when the bonding is performed in an environment other than a reducing atmosphere, such as air, nitrogen, or vacuum, a region which is not coated with the reducing agent is left as it is as the silver-oxide layer. This technique allows the introduction of an electrical circuit which utilizes a large difference in the resistance value between silver oxide and metallic oxide.

Meanwhile, by supplying the reducing agent to the entire surface of the electrode of the electronic member, it becomes possible to form the electrode surface other than the bonding surface into sintered silver. When the base board is composed of Ag, the sintered silver other than the bonding surface is integrated, thereby resulting in the implementation of a solidified bonding. Also, since no pressure application is imparted onto the electrode surface other than the bonding surface, the electrode surface becomes a coarsely-grained layer. As a result, if, for example, the electronic member is sealed with a resin after the bonding, a state is implemented where the resin is embedded into the coarsely-grained surface. This state enhances the bonding strength as compared with the ordinary state of the Ag electrode.

In addition to the use of the reducing agent, the use of a gas is also employable as the technique for reducing the silver-oxide layer into the silver layer. Namely, the electrical bonding between the electrodes can be established by imparting at least the 100-° C. to 400-° C. heat application to the bonding surface in a reducing-gas atmosphere, and imparting at least the 0.1-MPa to 20-MPa pressure application to the bonding surface when the silver oxide is reduced to the metallic silver. The gas employable as the reducing-gas atmosphere is a gas having the reducing effect on the silver oxide, such as hydrogen and formic acid. Also, effects can be expected on the reduction or oxidization prevention of the oxidized coating film existing on the uppermost surface of the electrode of the electronic part. In particular, executing the reduction in the hydrogen atmosphere results in the generation of only water vapor as the gas to be generated, thereby lowering contamination of the peripheral environment significantly.

Also, the co-use of a reducing agent and a reducing atmosphere (gas) is also employable as the technique for reducing the silver-oxide layer into the silver layer. Although the detailed explanation will be given below in a seventeenth embodiment, the non-electrolytic plating effect is exhibited depending on the type of the reducing agent. This non-electrolytic plating effect is that the silver particles generated by the reduction disperse into the reducing agent in its liquid state, and then deposit on the electrodes. This effect is not dependent on the magnitude of the pressure applied. Accordingly, when the bonding is performed with a low pressure application, introducing the liquid-phase reducing agent is preferable even in the hydrogen atmosphere.

Hereinafter, referring the accompanying drawings, the explanation will be given below concerning embodiments of the present invention. The present invention, however, is not limited to the embodiments employed hereinafter, but may be utilized in a combined manner of the embodiments.

Embodiment 1

In the first embodiment, an Ag-metalized layer is formed onto a CU wiring on the circuit board, using the electrolytic plating method. The thickness of the Ag-metalized layer is equal to 5 μm.

Next, the Ag-metalized layer is oxidized into a silver-oxide layer, using the anode oxidization method. In the anode oxidization, a sodium-hydroxide (NaOH) aqueous solution is used, then maintaining the current density ($mA/cm^2$) at a constant value. A Ni electrode is used as an opposed electrode.

Figure 3:
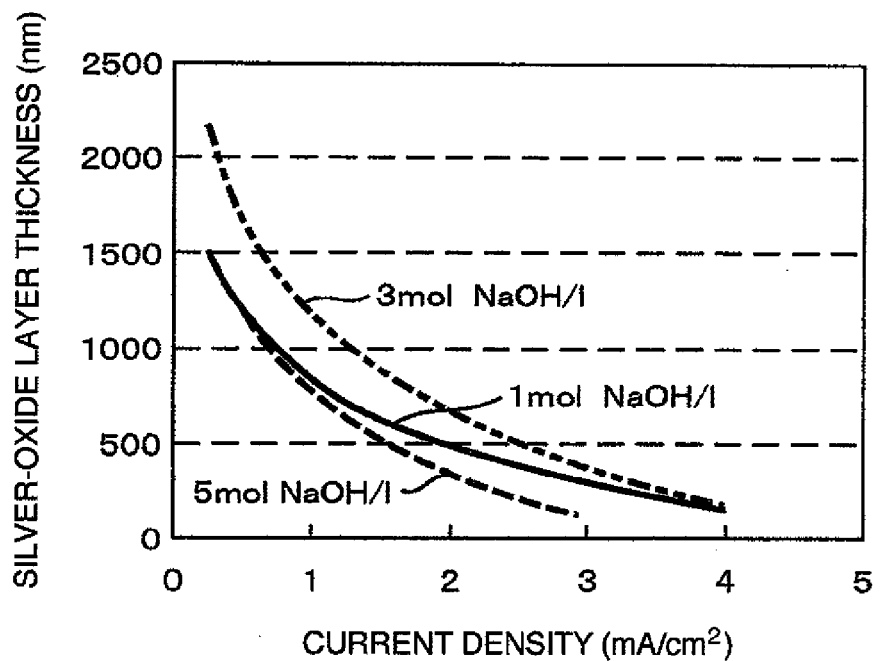
FIG. 3 is a graph for illustrating an embodiment according to the present invention, i.e., the relationship between an anode oxidization condition and thickness of the silver-oxide layer.

Changing the mole concentration of the sodium-hydroxide aqueous solution and the current value changes the pH and the current density, respectively. Then, the relationship among the pH, the current density, and the thickness of the silver-oxide layer is checked and clarified. The thickness of the silver-oxide layer is determined by cutting out its sample cross-section, observing the cross-section using a scanning electron microscope, and averaging 50 points in an arbitrary field-of-view. FIG. 3 illustrates the relationship among the pH, the current density, and the thickness of the silver-oxide layer.

As illustrated in FIG. 3, it has been found out that the values of the pH and the current density when the silver-oxide layer is manufactured allows the thickness of the silver-oxide layer to be generated to be controlled with a high accuracy. Making the current density lower makes it possible to make the thickness of the silver-oxide layer thicker, and making the current density higher makes it possible to make the thickness of the silver-oxide layer thinner.

Embodiment 2

A 5-μm-thick Ag-metalized layer is formed onto the CU wiring on the circuit board, using the electrolytic plating method. Then, the Ag-metalized layer is oxidized into a silver-oxide layer, using the ozone oxidization method. At this time, a 150-° C. and 5-vol %-ozone-concentration gas is sprayed over the Ag-metalized layer. It has been confirmed that this spray produces the silver-oxide layer, and that the thickness of the silver-oxide layer increases in accompaniment with an increase in the time during which the gas is sprayed.

Embodiment 3

In the third embodiment, the cross-sections of the silver-oxide layers manufactured in the first and second embodiments are observed using the scanning electron microscope. As a result of the execution of the one-hundred-thousands-times-magnification observation, a-few-nm to a-few-tens-nm several voids are merely observed in a dispersed manner. Accordingly, it has been found out that the silver-oxide layers with almost no void are formed. It is conceivable that this result is attributed to the fact that, when the Ag-metalized layers are oxidized into the silver-oxide layers, its reaction becomes a one where an increase in the volume occurs.

As the comparison with the above-described cases, a pressured-powder material is manufactured by imparting a 100-MPa pressure application to 1-μm to 3-μm-particle-diameter silver-oxide particles. A resin is embedded into the pressured-powder material manufactured, and its cross-section is cut out, then observing the cross-section using the scanning electron microscope. As a result of the execution of the ten-thousands-times-magnification observation, a-few-hundreds-nm to a-few-μm voids are observed in a dispersed manner. In this way, it has been found out that supplying the silver oxide in the layer-like configuration rather than the particle-like configuration allows the silver-oxide layer, which becomes the bonding material, to be supplied in the closely-packed manner.

Embodiment 4

In the fourth embodiment, the relationship between the thickness of the silver-oxide layer of the electronic-member surface and the bonding-portion strength of the bonding-accomplished unit according to the present invention is checked and clarified. A Ni plating and an Ag plating are applied onto the CU wiring on the circuit board from the CU side, using the electrolytic plating method (Ni-plating thickness: 2 μm, Ag-plating thickness: 3 μm). Next, in much the same way as in the first embodiment, the Ni plating and the Ag plating are anode-oxidized into a silver-oxide layer. The current density is controlled using a 3-mol/l-mole-concentration sodium-hydroxide aqueous solution, thereby changing the thickness of the silver-oxide layer.

A Si chip onto whose surface the Ag-metallization is applied is bonded to the circuit board in the air. The Si chip is set up after a triethylene-glycol solution is sprayed over the circuit board before the bonding. Then, the bonding is performed by imparting a heat-application step and a pressure-application step to the Si chip and the circuit board. The bonding conditions are given as follows: Bonding highest heat-application temperature is equal to 250° C., bonding time is equal to 150 s, and bonding applied-pressure is equal to 2.5 MPa. The bonding time is the sum total of a time for the temperature rise from room temperature to the bonding temperature, and a time during which the bonding highest heat-application temperature is retained.

Figure 4:
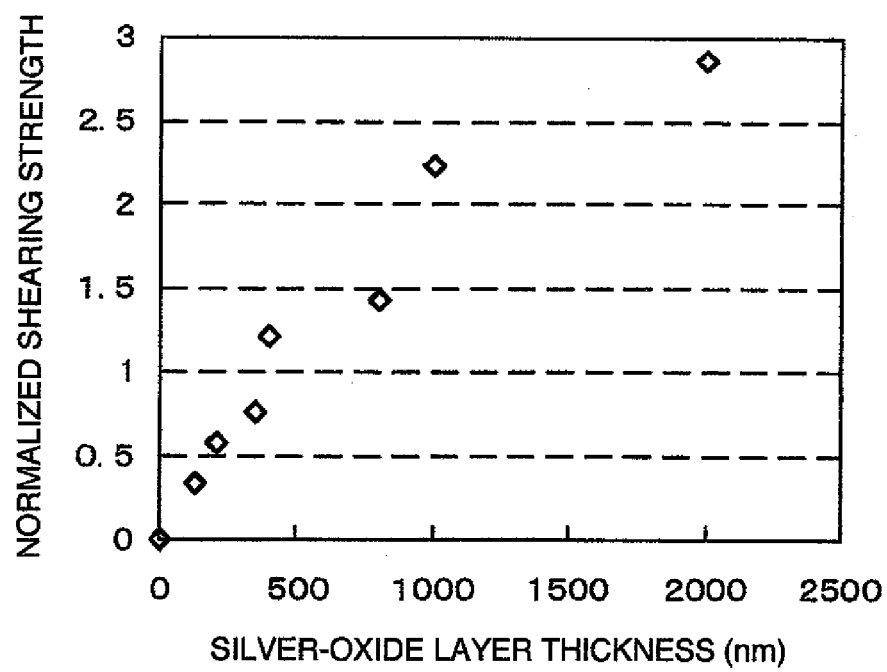
FIG. 4 is a graph for illustrating an embodiment according to the present invention, i.e., the relationship between the thickness of the silver-oxide layer and normalized shearing strength.

Next, with respect to the Si-chip bonding-accomplished unit manufactured based on the above-described bonding conditions, the bonding-portion strength under a pure shearing stress is measured. The device used for the shearing test is Bond Tester SS-100 KP (maximum load: 100 Kg) manufactured by Nishino Trading Corp. The shearing speed is set at 30 mm/min, and a test piece is ruptured using a shearing tool, then measuring the maximum load at the time of the rupturing. A value obtained by dividing the maximum load obtained in this way by the bonding area is defined as the shearing strength of the joint. Also, a room-temperature-hardening-type electrically-conductive paste is used as an indicator for the shearing strength at the time when the bonding material in the present embodiment is used. Namely, the electrically-conductive paste is employed as the relative strength ratio for the shearing strength of the bonding-portion strength of the bonding-accomplished unit according to the present invention. FIG. 4 illustrates its result. Also, the main resin component of the above-described electrically-conductive paste is an epoxy resin, and the electrically-conductive filler is an Ag flake.

As illustrated in FIG. 4, in the case of the Ag electrode where the silver-oxide layer is not formed, accomplishing the bonding strength has been found unsuccessful. Also, the thicker the thickness of the silver-oxide layer becomes, the higher the bonding strength becomes. Moreover, it has been found out that exhibiting the strength higher than the electrically-conductive paste makes it desirable that the thickness of the silver-oxide layer be equal to 400 nm or more. It is conceivable that this result is attributed to the following fact: When the silver oxide is reduced into the metallic silver, a decrease in the volume occurs. Accordingly, when the silver oxide is compressed into a direction perpendicular to the bonding surface, the silver oxide necessitates a thickness for forming the network in the closely-packed manner.

Embodiment 5

Figure 5:
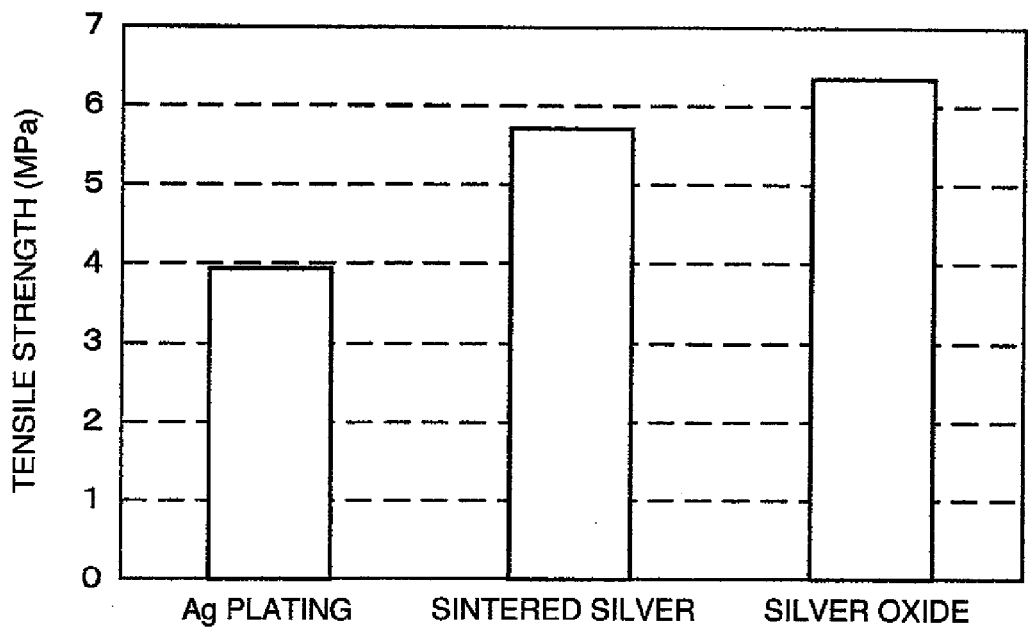
FIG. 5 is a graph for illustrating an embodiment according to the present invention, i.e., strength enhancement in an adhesive agent at the time when the surface is formed of a sintered-silver layer and the silver-oxide layer.

In the fifth embodiment, the close-bonding degree between the silver-oxide layer and the Ag-metalized layer when the base board of the silver-oxide layer is formed into the Ag-metalized layer is checked and clarified. A bonded test piece used in the measurement is a 10-mm-diameter and 25-mm-thick test piece composed of oxygen-free copper. A 2-μm-thick Ni plating and a 2-μm-thick Ag plating are applied onto the CU surface, using the electrolytic plating method. A 1-μm-thick silver-oxide layer is imparted onto the one side of the test piece, using the method in the first embodiment. Next, the surfaces themselves, onto which the silver-oxide layer is imparted, are mutually bonded using an epoxy-based adhesive agent. Moreover, the tensile strength of the resultant bonding-accomplished unit is measured. For the comparison with the above-described case, the following tensile strengths are also measured: The mutual tensile strength of the Ag platings themselves to which no oxidization processing is applied, and the mutual tensile strength of sintered-silver layers themselves in a case of the surfaces where the silver-oxide layer is sintered by being heated in the hydrogen atmosphere at the 250-° C. bonding highest heat-application temperature and for a 300-s bonding time. FIG. 5 illustrates its result.

Also, destructed locations of the resultant bonding-accomplished units are checked and clarified by being observed using an optical microscope. As a result, the mutual bonding-accomplished unit of the Ag platings themselves is destructed at an interfacial plane between the adhesive agent and the Ag platings. Furthermore, the mutual bonding-accomplished unit of the sintered silvers themselves, and the mutual bonding-accomplished unit of the silver-oxide layers themselves are destructed in the adhesive agent. Consequently, it is found out that the close-bonding strength between the sintered silver or the silver-oxide layer and the base-board Ag is equal to the 5-MPa-or-more tensile strength. Also, it is found out that the close-bonding strength between the sintered silver or the silver-oxide layer and the adhesive agent has enhanced as compared with the case of the Ag plating. It is conceivable that this result is attributed to the fact that the surface of the sintered silver or the silver-oxide layer is coarsely-grained, and that an increase in the bonding area occurs.

Embodiment 6

Figure 6:
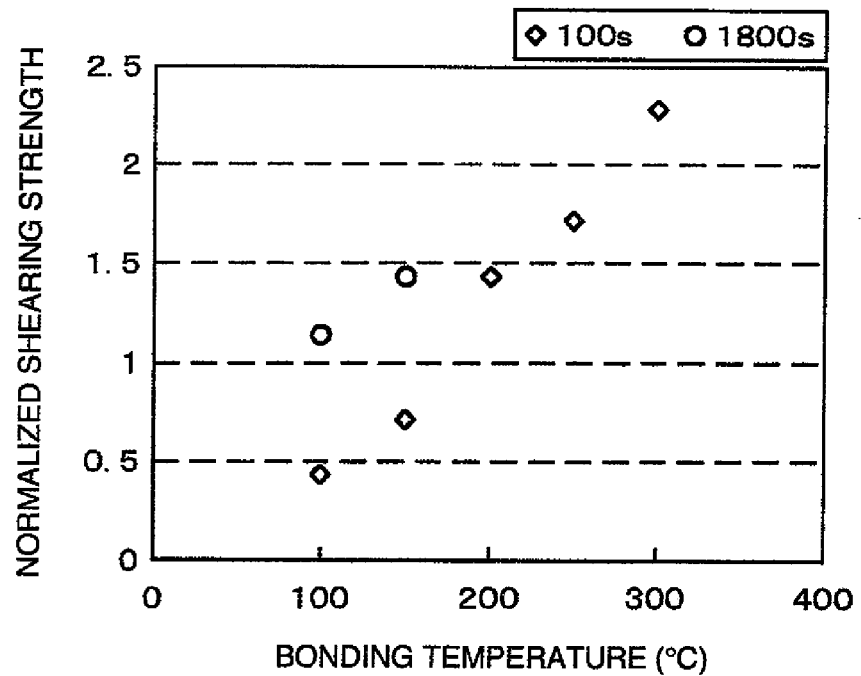
FIG. 6 is a graph for illustrating an embodiment according to the present invention, i.e., the relationship between the bonding temperature, maintaining time and the normalized shearing strength.

In the sixth embodiment, the relationship between the bonding temperature and the bonding-portion strength is checked and clarified. A sample checked is prepared in much the same way as in the fourth embodiment. The silver-oxide layer is formed so that its thickness becomes equal to 1 μm. Also, hydrogen is selected as the bonding atmosphere. The influence exerted by the highest heat-application temperature is checked and clarified under the following bonding conditions: The highest heat-application temperature is set at 100, 150, 200, 250, and 300° C. Simultaneously, the bonding applied-pressure and the retention time are maintained at constant values, i.e., 1.0 MPa and 100 s, respectively. Also, the influence exerted by the retention time is checked and clarified under the bonding conditions that the retention time is set at 1800 s with the highest heat-application temperature maintained at 100° C. The bonding-portion strength is measured in much the same way as in the fourth embodiment. FIG. 6 illustrates its result.

As illustrated in FIG. 6, the bonding-portion strength increases in accompaniment with a rise in the bonding temperature. As a result, exhibiting the 1-or-more normalized shearing strength has been found to be successful when the bonding temperature is set at 200° C. Also, it has been found out that, even if the bonding temperature is made equal to 100° C. and 150° C., increasing the retention time makes it successful to exhibit the 1-or-more normalized shearing strength. Namely, the bonding-portion strength is made implementable even if the bonding temperature is equal to 100° C. This result allows an organic substance, which is unusable from the viewpoint of its heat-resistant property, to be introduced into the configuration of the bonding-accomplished unit.

Embodiment 7

In the seventh embodiment, the relationship between the bonding applied-pressure and the bonding-portion strength in the case where the bonding material according to the present invention is used is checked and clarified. In much the same way as in the fourth embodiment, a 5-μm-thick Ag-metalized layer is formed onto the CU wiring on the circuit board, using the electrolytic plating method. Then, a 1-μm-thick silver-oxide layer is formed, using the anode oxidization method. When the bonding applied-pressure increases, and the bonding-portion strength increases accordingly, the Si chip is destructed at the time of measuring the shearing strength. Consequently, the CU board onto which the Ag plating is applied is used here.

Figure 7:
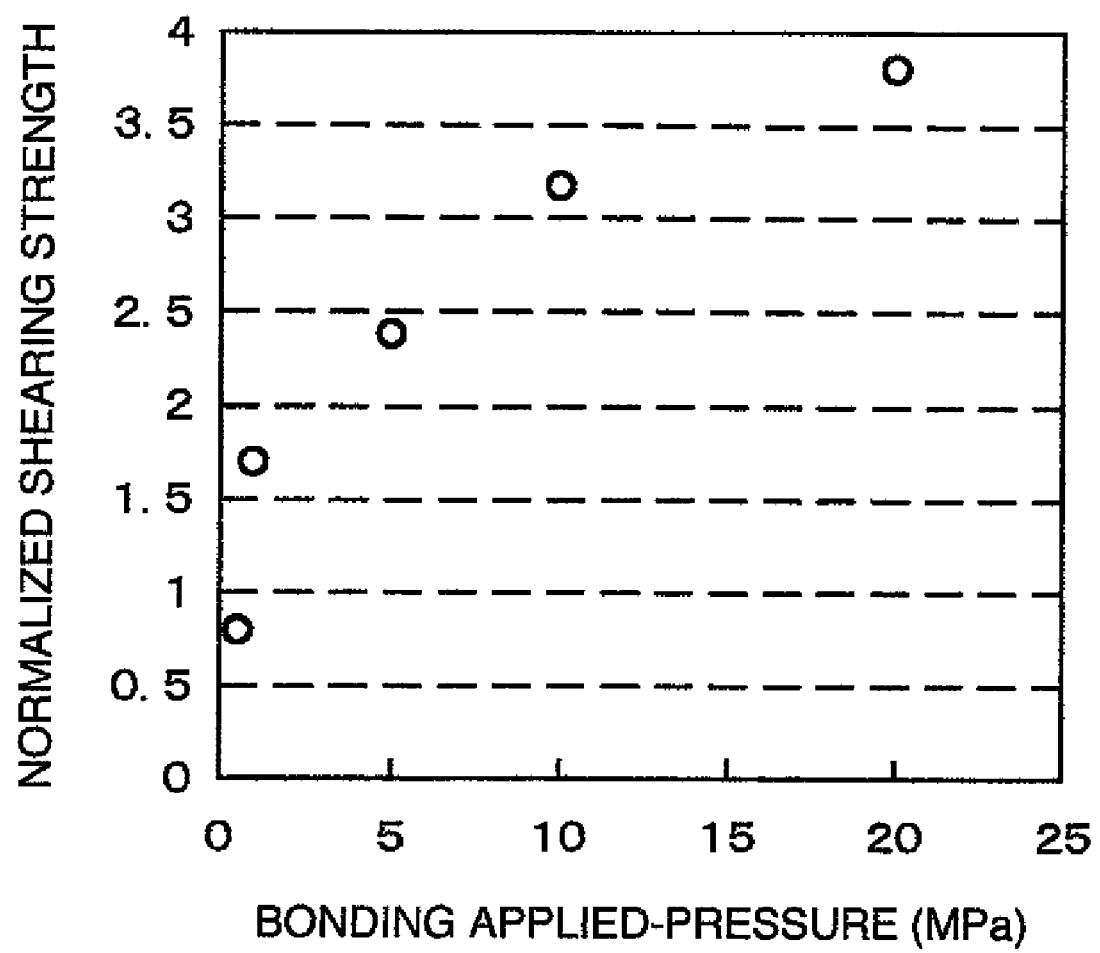
FIG. 7 is a graph for illustrating an embodiment according to the present invention, i.e., the relationship between magnitude of the bonding applied pressure and the normalized shearing strength.

Before the bonding, the CU board is coated with a mixed solution of cetyl alcohol and ethyl alcohol, which functions as a reducing agent for the surface of the silver-oxide layer. Then, the bonding is performed in the air by imparting the heat-application step and the pressure-application step thereto. The effect brought by the bonding applied-pressure is checked and clarified under the following bonding conditions: The highest heat-application temperature and the retention time are maintained at constant values, i.e., 250° C. and 150 s, respectively. Moreover, the bonding applied-pressure is changed within a range of 0.5 MPa to 20 MPa. FIG. 7 illustrates its result.

As illustrated in FIG. 7, it has been recognized that there exists a tendency that the bonding-portion strength increases in accompaniment with an increase in the bonding applied-pressure. Also, it has been found out that, when the bonding temperature is equal to 250° C. and the bonding time is equal to 150 s, the bonding applied-pressure becomes equal to about 1.0 MPa or more, and that exhibiting the 1-or-more normalized shearing strength is found to be successful. As explained in the sixth embodiment, however, even in the case of basically the same bonding applied-pressure, the rise in the bonding temperature or the increase in the retention time makes it possible to enhance the bonding-portion strength. Namely, as long as the 0.1-MPa-or-more bonding applied-pressure is present, the increase in the bonding temperature or the retention time allows the accomplishment of the metallic bond.

Embodiment 8

In the eighth embodiment, the explanation will be given below concerning an example where the bonding strength is increased by improving the configuration provided in the seventh embodiment. As an improved sample A, Ag bumps are formed between the CU wiring and the Ag-metalized layer. Next, the bonding is performed under the bonding conditions of the 250-° C. bonding temperature, 0.5-MPa bonding applied-pressure, and 150-s bonding time, using the basically the same technique as in the seventh embodiment. This improvement has resulted in acquisition of the normalized shearing strength of 1.0. Furthermore, as an improved sample B, curvature is imparted onto the Ag bumps. This improvement has resulted in acquisition of the normalized shearing strength of 1.2. It has been found out that, in this way, the bonding strength is increased by imparting the bumps thereby to change the shape of the bonding-accomplished unit into the one which makes the pressure application more likely to be imparted onto the bonded surface.

Next, bumps composed of Al are formed. Then, hydrogen is selected as the reducing agent. Furthermore, the bonding is performed under the bonding conditions of 100-° C. bonding temperature, 1.0-MPa bonding applied-pressure, and 1800-s retention time, using the basically the same technique as in the sixth embodiment. This improvement has resulted in acquisition of the normalized shearing strength of 1.3. Next, bumps composed of a Sn-3.5 Ag alloy are formed. This improvement has resulted in acquisition of the normalized shearing strength of 1.5. It has been found out that, in this way, imparting a high-deformation-capability and low-hardness metal as the bumps increases the bonding strength.

Embodiment 9

As explained in the seventh embodiment, implementing the increase in the bonding applied-pressure at the time of the bonding allows the implementation of the increase in the bonding-portion strength. Depending on magnitude of the pressure application to be imparted, however, there is a possibility that electronic members to be bonded to each other (e.g., a semiconductor chip, and wirings and electrodes formed on its upper surface) will be physically damaged. As indicated on Table 1, imparting a 10-MPa-or-more bonding applied-pressure, in some cases, results in the occurrence of damage in a semiconductor chip to be bonded. In contrast thereto, according to the present invention, the bonding is made implementable even if the bonding-process temperature is equal to about 100° C. as is explained in the sixth embodiment. Accordingly, an organic material having a stress-absorbing effect, such as a synthesized resin, is made available for preventing the damage in the semiconductor chip. In order to confirm this effect, the pressure application is imparted to the semiconductor chip which is protected with polypropylene. Then, it has been found out that no damage is caused to occur even when a 20-MPa bonding applied-pressure is imparted to the semiconductor chip.

TABLE 1

| | applied pressure (MPa) | | | |
| --- | --- | --- | --- | --- |
| | 1 | 5 | 7.5 | 10 |
| state of semiconductor chip | undamaged | undamaged | undamaged | damaged |

Embodiment 10

In the tenth embodiment, the explanation will be given below regarding a lead frame according to the present invention, and a semiconductor package (i.e., QFP) using this lead frame. A Fe alloy and a Cu alloy exist as the material for the lead frame.

Figure 8A:
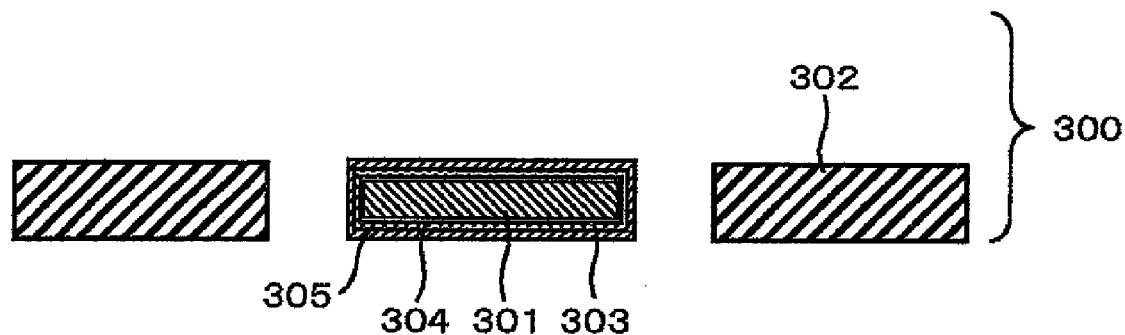
FIG. 8A and FIG. 8B are cross-sectional schematic diagrams for illustrating an embodiment according to the present invention, i.e., the structure of a lead frame including the silver-oxide layer on its surface, and the structure of a QFP using this lead frame.

FIG. 8A is a cross-sectional schematic diagram of the lead frame 300 according to the present invention. The lead frame 300 is configured with a die pad 301 on which a die such as Si chip is mounted, and a lead 302 for inputting/outputting an electrical signal. For example, using the electrolytic plating method, a 2-μm-thick Ni plating 303 and a 2-μm-thick Ag plating 304 are applied from the CU side onto the die pad 301 of the (0.3-mm-thick) lead frame which is composed of a Cu—$Cu_2$ composite material. Next, the Ag plating is anode-oxidized, thereby forming a 1-μm-thick silver-oxide layer 305.

Figure 8B:
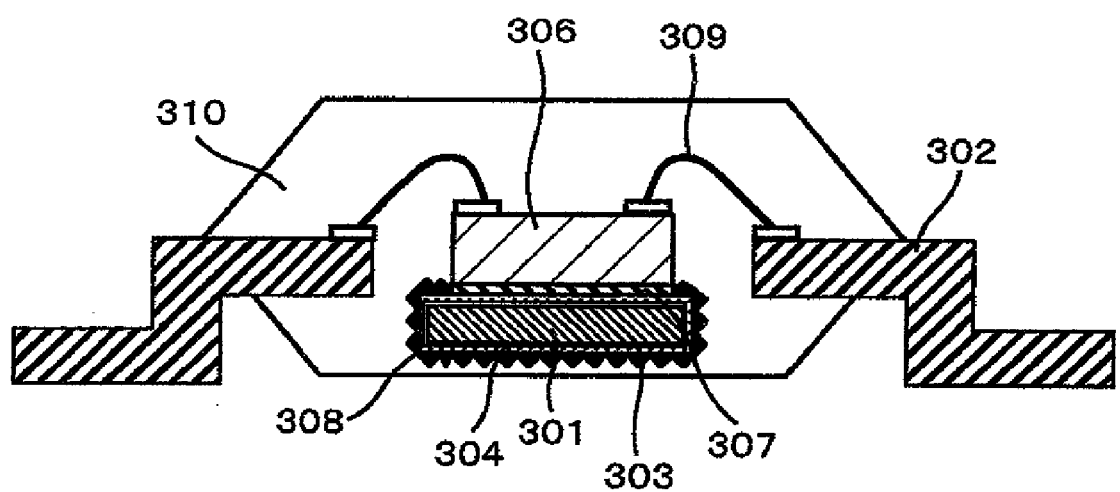

FIG. 8B is a cross-sectional schematic diagram of the QFP according to the present invention. The uppermost surface of the silver-oxide layer illustrated in FIG. 8A is coated with a decanoic acid, thereby forming this uppermost surface into a decanoic-acid silver compound. The decanoic-acid silver compound functions as a reducing agent for the silver oxide. Subsequently, a (1-mm×1-mm×0.3-mm-in-size) Si element, onto whose surface a Au plating is applied, is mounted as a semiconductor element 306. The bonding processing is performed under the bonding conditions that the 280-° C. bonding temperature, 1.5-MPa bonding applied-pressure, and 30-s bonding time are imparted. As a result, the Si element is bonded to the compound via a bonding layer 307 which is mainly composed of sintered silver. Also, on account of this processing, a coarsely-grained layer 308 composed of the sintered silver is formed on the die-pad surface.

The electrical connection between electrodes on the Si element 306 and the lead 302 is established using the ultra-sound bonding of Au wires 309. After that, the main portion, onto which the Si element 306 and the Au wires 309 are provided, is covered with an epoxy resin 310 by being subjected to the transfer mold. At this time, it is found out that, as described earlier, the interfacial-plane close-bonding strength between the coarsely-grained layer 308 and the epoxy resin 310 has enhanced. Moreover, the lead frame 300 is cut off at the stage where the transfer mold with the epoxy resin 310 has been completed. This processing allows the function as mutually independent terminals to be imparted to the resultant cut-off units.

Embodiment 11

In the eleventh embodiment, the explanation will be given below concerning the lead frame according to the present invention, and the semiconductor package (i.e., QFP) using this lead frame.

Figure 9A:
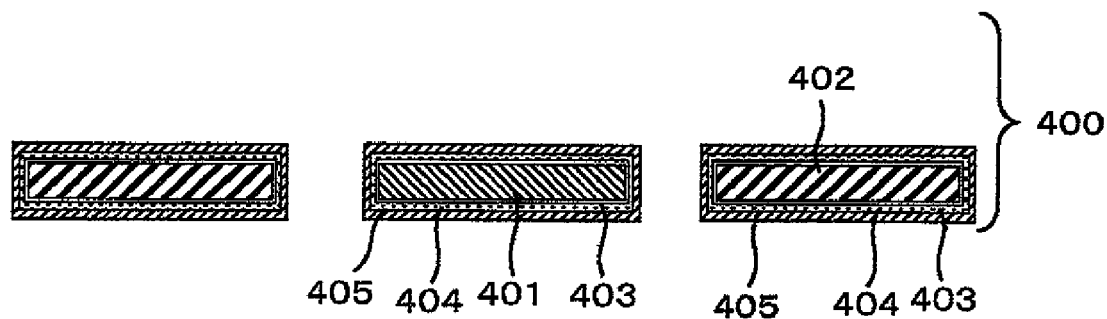
FIG. 9A and FIG. 9B are cross-sectional schematic diagrams for illustrating the embodiment according to the present invention, i.e., the structure of the lead frame including the silver-oxide layer on its surface, and the structure of the QFP using this lead frame.

FIG. 9A is a cross-sectional schematic diagram of the lead frame 400 whose structure is modified into a one where the silver-oxide layer is also imparted onto the lead 302 illustrated in FIG. 8A. Using the electrolytic plating method, a 2-μm-thick Ni plating 403 and a 2-μm-thick Ag plating 404 are applied from the CU side onto the entire surfaces of a die pad 401 and a lead 402. Next, the Ag plating is anode-oxidized, thereby forming a 1-μm-thick silver-oxide layer 405.

Figure 9B:
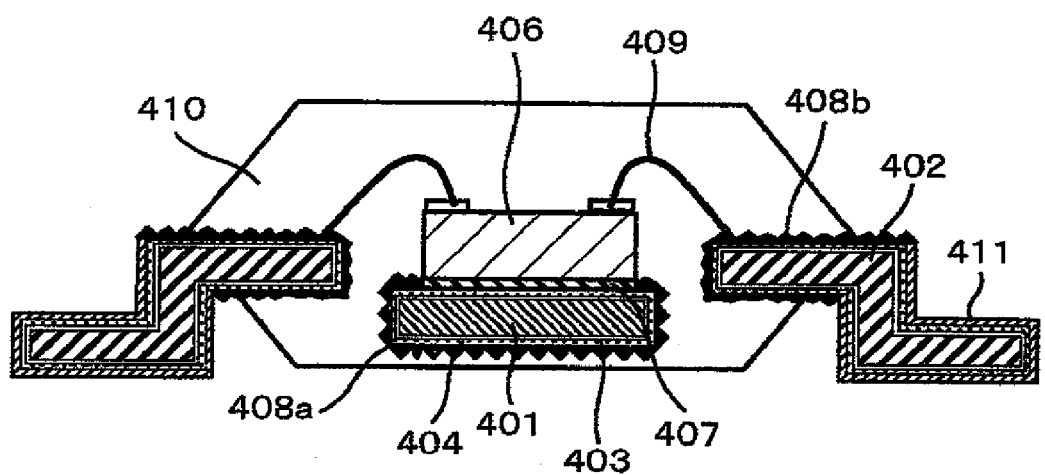

FIG. 9B is a cross-sectional schematic diagram of the QFP according to the present invention. As a pre-packaging processing step, the supply of the reducing agent onto the surface of the silver-oxide layer is limited onto a bonding layer 407, a coarsely-grained layer 408a, and a coarsely-grained layer 408b, which are the layers other than the region over which the package is to be implemented after that. The bonding conditions for bonding a Si element 406 with the die pad 401 are the 280-° C. bonding temperature, 1.5-MPa bonding applied-pressure, and 30-s bonding time. The region over which the package is to be implemented is not reduced as the silver-oxide layer 411.

The electrical connection between electrodes on the Si element 406 and the lead 402 is established using the ultra-sound bonding of Au wires 409. After that, in much the same way as the case described earlier, the main portion is covered with an epoxy resin 410 by being subjected to the transfer mold. At this time, it is found out that the interfacial-plane close-bonding strength between the entire surface of the lead frame (i.e., coarsely-grained layer 408a and coarsely-grained layer 408b) and the epoxy resin has enhanced even further than the case described earlier.

The lead frame 400 is cut off at the stage where the transfer mold with the epoxy resin 410 has been completed. This processing allows the function as mutually independent terminals to be imparted to the resultant cut-off units. Next, the silver-oxide layer 411 is immersed into, e.g., triethylene glycol, then being subjected to the heat application and pressure application. This processing allows the QFP to be implemented for the electrodes on the circuit board.

Embodiment 12

Figure 10A:
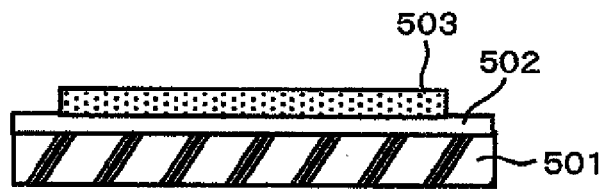
FIG. 10A to FIG. 10E are cross-sectional schematic diagrams for illustrating a TAB carrier tape including the silver-oxide layer on its surface.
Figure 10B:
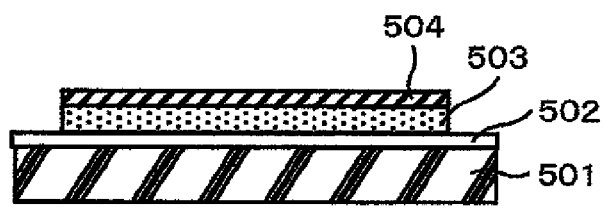
Figure 10C:
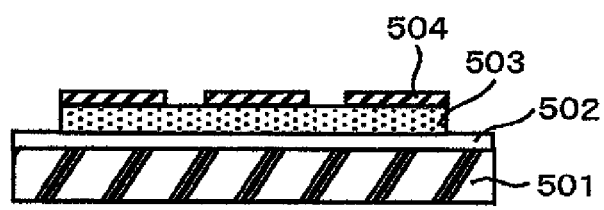
Figure 10D:
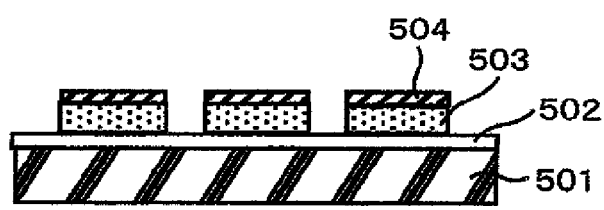
Figure 10E:
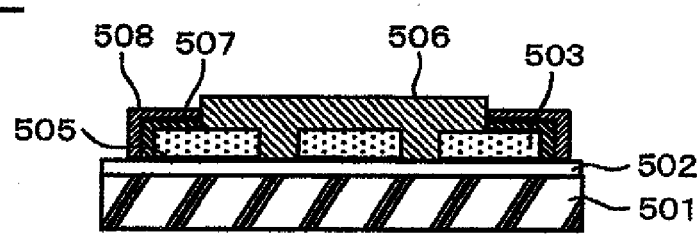

In the twelfth embodiment, the explanation will be given below regarding a TAB carrier tape according to the present invention. As illustrated in FIG. 10A, a Cu foil 503 is pasted on an insulating-property film 501, such as polyethylene-terephthalate film and polyimide film, via an adhesive-agent layer 502. Next, as illustrated in FIG. 10B, a photoresist film is formed on the Cu foil 503. Moreover, as illustrated in FIG. 10C, the photoresist film is exposed to light, then being developed. Furthermore, as illustrated in FIG. 10D, the Cu foil 503 is etched, thereby forming a wiring pattern. In the twelfth embodiment, the Cu foil 503 has been pasted using the adhesive-agent layer. The conductor formation onto the insulating-property film, however, may be performed using, e.g., a technique of applying the plating via a Ni-alloy sputtering layer.

As an insulating layer, a photoresist film is formed by being coated on the region other than a connection terminal region 505 of the wiring pattern. In addition, an Ag plating 507 is applied onto the connection terminal region 505, i.e., an exposed region. Finally, part of the Ag plating is formed into a silver-oxide layer 508. This allows completion of the TAB carrier tape.

The completed TAB carrier tape is used such that Au bumps of a Si chip and the silver-oxide layer 508 are combined with each other on a device hole. The bonding is made executable using the methods described up to now. Accordingly, the electronic part can be manufactured at a lower temperature and with a lower pressure application as compared with the conventional heat pressure bonding method. Also, using basically the same technique, the silver-oxide layer is also imparted onto a COF (: Chip on Film), which is a mode where the device hole does not exist. This makes the silver-oxide-layer-imparted COF usable as an electronic-part implementation material.

Embodiment 13

Figure 11A:
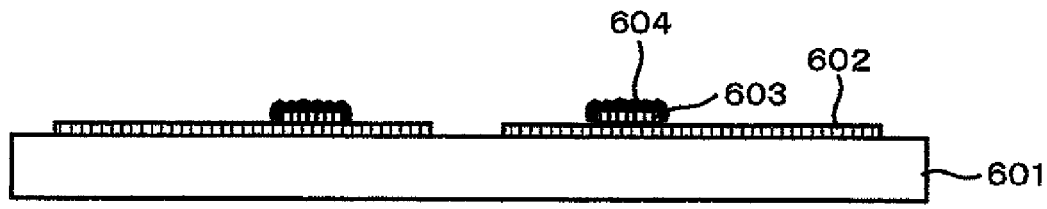
FIG. 11A and FIG. 11B are cross-sectional schematic diagrams for illustrating an embodiment according to the present invention, i.e., a RFID-use-antenna-equipped board and a RFID tag using this board.

In the thirteenth embodiment, the explanation will be given below concerning RFID according to the present invention. FIG. 11A is a cross-sectional schematic diagram for illustrating a RFID-use antenna board. As illustrated in FIG. 11A, a metallic antenna 602 composed of Cu or Al is set up on an insulating-property film 601 such as, e.g., polyethylene-terephthalate film and acrylonitrile-butadiene-styrene-copolymer film. The techniques employable as the set-up method for the antenna 602 are as follows: A technique of forming the film by applying the plating or evaporation, and etching the film, a technique of performing the printing with an electrically-conductive ink, and performing the fire-formation, and a technique of bonding the metallic foil with an adhesive agent.

Next, electrodes for mounting a RFID chip thereon are formed. The surfaces of metalized layers 603, which become the electrodes, are formed into Ag-metalized layers. Moreover, the partial layers or entire layers of the Ag-metalized layers are formed into silver-oxide layers 604.

Figure 11B:
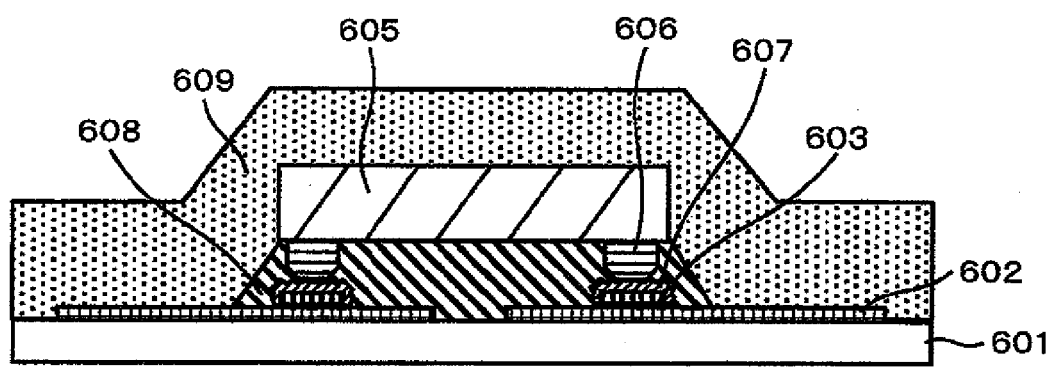

FIG. 11B is a cross-sectional schematic diagram for illustrating a RFID tag. The RFID chip 605 is mounted on the silver-oxide layers 604 of the antenna board illustrated in FIG. 11A. Bump electrodes of the RFID chip 605 are flip-chip implemented in coincidence with the silver-oxide layers 604. As described earlier, the bonding is made executable at a lower temperature and with a lower pressure application as compared with the conventional techniques. Antenna-side electrodes 603 and the bump electrodes 606 are electrically connected to each other via a bonding layer 607 which is mainly composed of sintered silver. Also, after the chip 605 is mounted on the silver-oxide layers, the sealing is performed with an epoxy resin as under fillers 608. At this time, since coarsely-grained layers are formed on the electrodes on the antenna board, the close-bonding property with the epoxy resin enhances. Finally, the lamination is implemented using polyethylene terephthalate or the like (609).

Also, the bonding with no bumps implemented as is illustrated in FIG. 2A to FIG. 2C is also executable. This bonding makes it possible to accomplish the low-back implementation of the bonding portion. The antenna is formed of Ag, or the Ag-metalized layer is formed on the entire surface of antenna, then being formed into the silver-oxide layer. As a result, simultaneously with the bonding, the entire surface becomes the coarsely-grained layer. This feature allows formation of the structure which accomplishes an enhancement in the close-bonding property of the resin or the laminated material.

Embodiment 14

Figure 12:
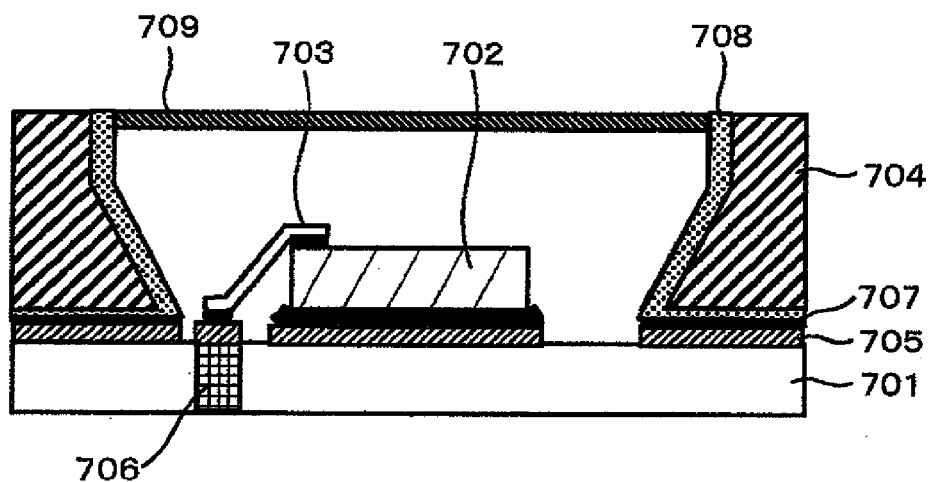
FIG. 12 is a cross-sectional schematic diagram for illustrating an embodiment according to the present invention, i.e., a LED package.

In the fourteenth embodiment, the explanation will be given below regarding a LED package according to the present invention. FIG. 12 is a cross-sectional schematic diagram for illustrating the LED package. A metalized layer 705 for mounting thereon a LED chip 702, a metallic wiring 703 (lead, ribbon), and a reflector 704 is formed on an organic board 701 (ceramics board, organic film). Also, a reference numeral 706 denotes a wiring. The mount-on of each part is performed via a bonding layer 707 which is mainly composed of sintered silver.

In the LED implementation, the increase in the heat-liberation amount has become the problem. The bonding portion, however, is composed of metallic silver, which makes it possible to enhance the heat-liberation property. Also, in the bonding where a resin is mainly used, there has existed a problem that, depending on the light-emitting band, the bonding portion is deteriorated by being irradiated with ultraviolet light. The bonding portion, however, is composed of metallic silver, which makes it possible to enhance the connection reliability.

In the LED package, in some cases, the reflector 704, onto which an Ag-metalized layer 708 is applied, is used in order to enhance the light irradiation efficiency of the LED package. This Ag-metalized layer is formed onto the entire surface as is illustrated in FIG. 12, then forming the bonding portion with a metalized layer 705 into a silver-oxide layer. Moreover, it becomes possible to enhance the heat-liberation property by taking advantage of the metalized layer 705 and bonding layer 707 which are not electrically connected to the wiring. Also, a fluorescent substance 709 is fixed onto the LED package, depending on the requirements.

Embodiment 15

Figure 13A:
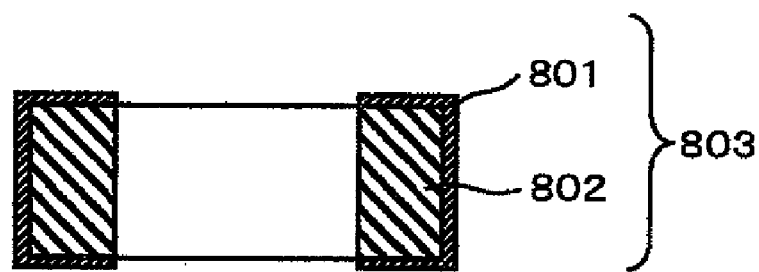
FIG. 13A to FIG. 13C are cross-sectional schematic diagrams for illustrating an embodiment according to the present invention, i.e., the electronic member including the silver-oxide layer on its surface.

In the fifteenth embodiment, the explanation will be given below concerning a parts-built-in-type multi-layer wiring board. FIG. 13A is a cross-sectional schematic diagram for illustrating a part which is to be built into the parts-built-in-type multi-layer wiring board. FIG. 13A is the cross-sectional schematic diagram for illustrating a passive part 803 such as inductor, capacitor, or resistor. Here, metalized layers 802 are formed on electrodes, then forming silver-oxide layers 801 on the surfaces of the metalized layers. The metalized layers and the silver-oxide layers can be manufactured using the barrel plating.

Figure 13B:
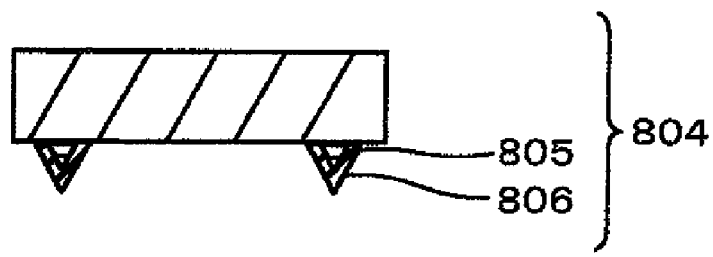
Figure 13C:
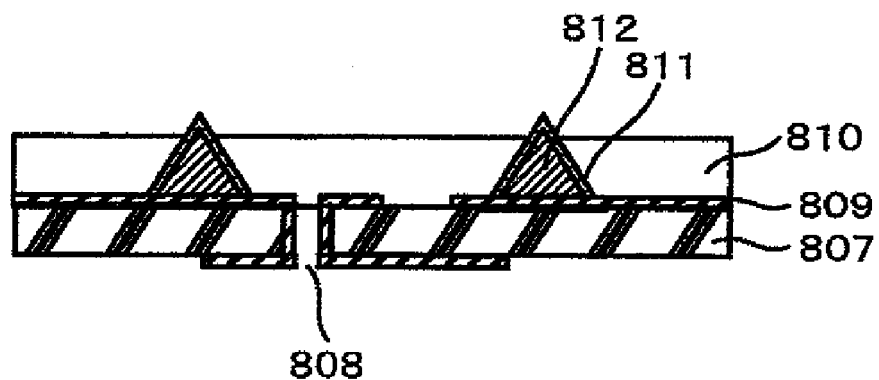

FIG. 13B is a cross-sectional schematic diagram for illustrating a LSI chip 804. On the LSI chip 804, bumps 805 provided on electrodes are formed into a protrusion-like configuration, then forming silver-oxide layers 806 thereon. Also, FIG. 13C illustrates a cross-sectional schematic diagram between a partial core layer and layers of the multi-layer wiring board. The electric conduction in the height direction of cores 807 is implemented by wirings 809 on the surface of a through hole 808. The electric conduction in inter-layer preimpregnations 810 is implemented by bump-like feedthrough electrodes 812 on whose surfaces silver-oxide layers 811 are provided. Also, the silver-oxide layers 811 may be provided on the surfaces (i.e., interfacial planes between the preimpregnations 810 and the wirings 809) of the wirings 809.

Figure 14:
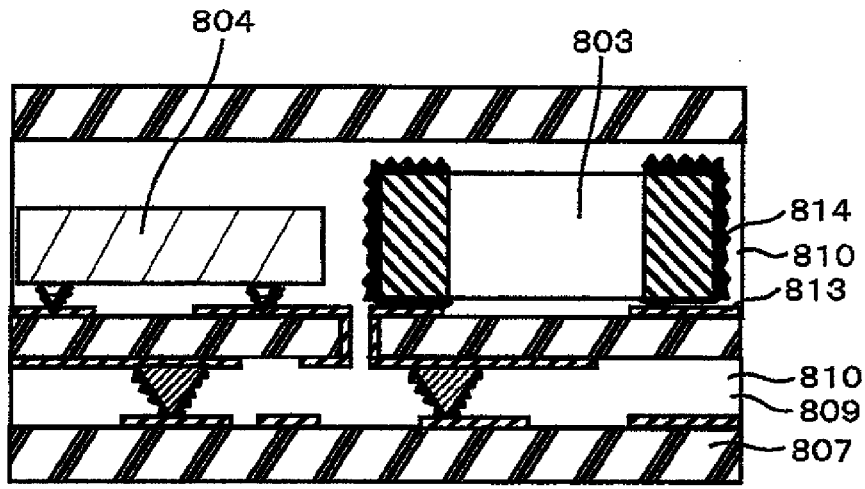
FIG. 14 is a cross-sectional schematic diagram for illustrating an embodiment according to the present invention, i.e., a parts-built-in-type multi-layer wiring board.

FIG. 14 is a cross-sectional schematic diagram for illustrating the parts-built-in-type multi-layer wiring board which is manufactured using the above-described parts. The passive part 803, the LSI chip 804, and the feed-through electrodes 812 are bonded to each other based on the techniques described earlier, and using the silver particles generated from the reduction of the silver oxide. The resultant bonding-accomplished unit is mounted on electrodes via sintered-silver layers 813. The silver-oxide layers other than the respective bonded locations become sintered-silver layers 814. This makes it possible to enhance the close-bonding strength with the preimpregnations 810. Also, the high-hardness silver-oxide layers, like the bumps 805 and the feed-through electrodes 812, are provided on the surfaces of the bumps. This makes it possible to destruct the oxidized coating film of the bonding partner with a lower pressure application.

Figure 15:
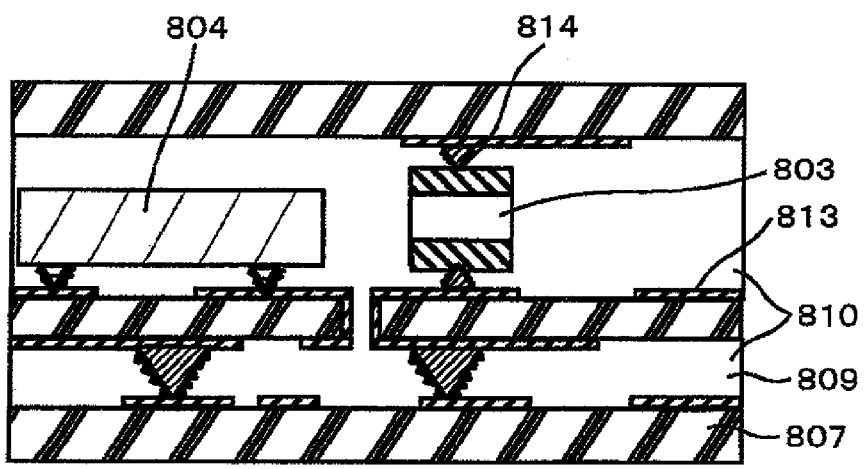
FIG. 15 is a cross-sectional schematic diagram for illustrating the embodiment according to the present invention, i.e., the parts-built-in-type multi-layer wiring board.
Figure 16:
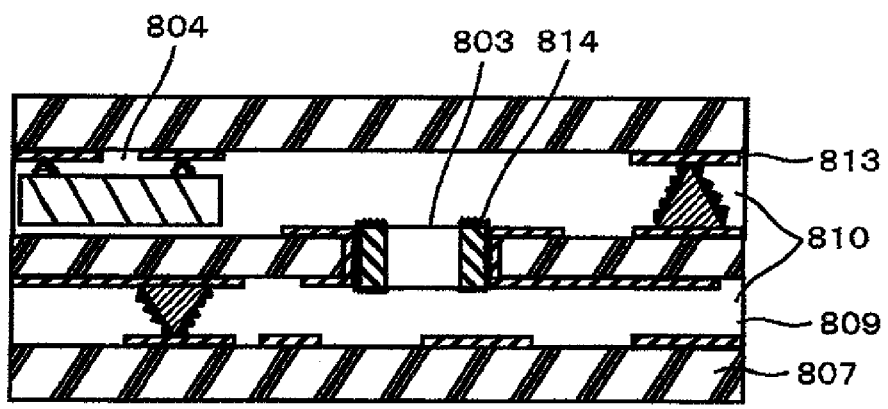
FIG. 16 is a cross-sectional schematic diagram for illustrating the embodiment according to the present invention, i.e., the parts-built-in-type multi-layer wiring board.

Also, the electrodes of the electronic parts are electrically connected to each other in the perpendicular direction as is illustrated in FIG. 15, or are electrically connected to each other in the parallel direction as is illustrated in FIG. 16. This change in the connection direction allows the thickness of the laminated board to be minimized in agreement with the sizes of the electronic parts, or allows the heat-liberation property to be taken into consideration. This results in accomplishment of the high degree of freedom in the design.

In the three-dimensional implementation, the control in the height direction is important. In the bonding mode according to the present invention, there exists an effect of being capable of making the heights of the bonding layers smaller, causing no inclination to occur, and generating less gas at the time of the bonding. Also, since each bonding layer is thin, there exists an effect of being capable of manufacturing a circuit which causes only a small delay to occur in an electrical signal.

Embodiment 16

Figure 17:
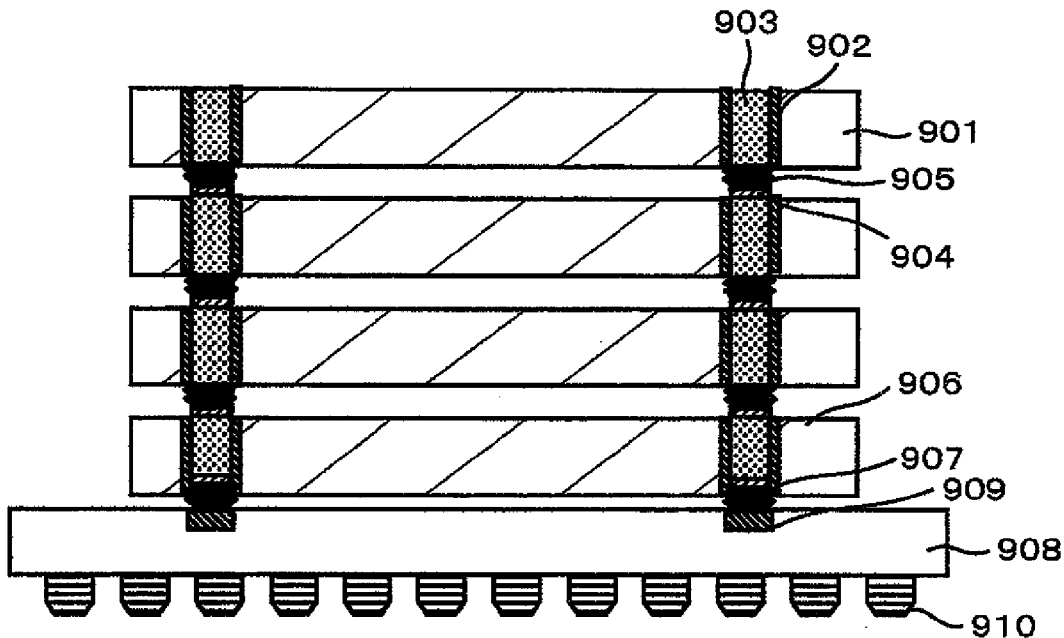
FIG. 17 is a cross-sectional schematic diagram for illustrating an embodiment according to the present invention, i.e., a laminated chip.

In the sixteenth embodiment, the explanation will be given below regarding a laminated chip according to the present invention. FIG. 17 is a cross-sectional schematic diagram for illustrating the laminated chip. Feed-through electrodes 903 are provided on a semiconductor element 901 via insulating layers 902. Also, Ag metalized layers 904 are formed on the one side of the semiconductor element at the time of forming the feed-through electrodes. Furthermore, silver-oxide layers are formed thereon. Using the silver-oxide layers, a plurality of laminated chips are laminated via bonding layers 905 which are mainly composed of sintered silver.

Meanwhile, the semiconductor element 906 on both sides of which the Ag metalized layers are formed is manufactured as follows: When the feed-through electrodes are composed of not Ag but, e.g., Cu, an Ag plating is applied first, and then a CU plating is applied, and further, the Ag plating is applied. After that, a dicing is applied to the semiconductor element. This dicing allows a partial layer of Ag metalized layers 907 to be anode-oxidized, thereby making it possible to bond electrodes 909 of an interposer 908 thereto. Also, it is possible to form the Ag metalized layer on only the one side of the semiconductor element, and to bond the Ag metalized layer to the interposer 908 using the wax bonding or pressure bonding method. Furthermore, with respect to the bonding between bumps 910 provided on the interposer 908 and the circuit board, the present invention may be used, or other bonding methods are available.

Embodiment 17

In the seventeenth embodiment, the influence exerted on the bonding-portion strength by bonding-partner's electrode species is checked and clarified. A sample checked is prepared in much the same way as in the fourth embodiment. The silver-oxide layer is formed so that its thickness becomes equal to 1 μm. Also, hydrogen is selected as the bonding atmosphere. The surface electrode of the bonding partner is changed just as Ag, Au, Pt, Pd, Cu, and Ni. The bonding conditions employed and set are the 250-° C. highest heat-application temperature, 2.5-MPa bonding applied-pressure, and 100-s retention time.

Figure 18:
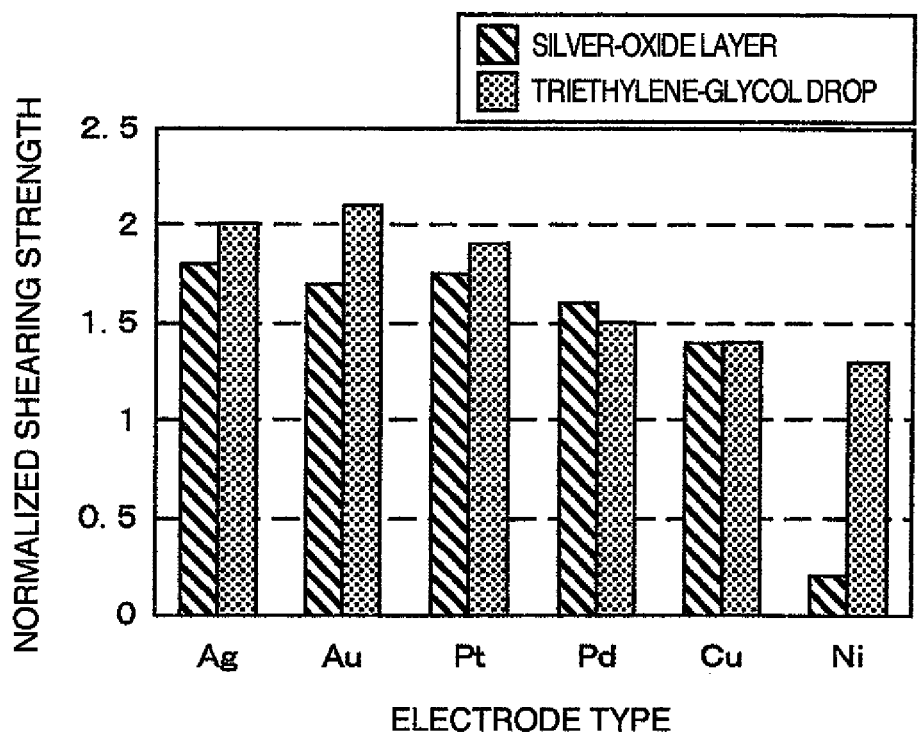
FIG. 18 is a graph for illustrating an embodiment according to the present invention, i.e., the relationship between respective types of electrodes and the normalized shearing strength.

FIG. 18 illustrates the value of the normalized shearing strength of a silver-oxide sheet bonded without applying a reducing agent, and, further, the value of the normalized shearing strength of a silver-oxide sheet onto which a drop of triethylene glycol is applied. It has been found out that the electrode types other than a Ni electrode exhibit substantially the same shearing strength. In the case of the bonding with the Ni electrode, however, it has been recognized that the drop of triethylene glycol results in a significant rise in the shearing strength. This is attributed to the fact that the non-electrolytic plating effect is exhibited by the drop of triethylene glycol. Namely, the silver particles generated by the reduction disperse into triethylene glycol, and then deposit on the electrode. This effect is not dependent on the magnitude of the pressure applied. Accordingly, when the bonding is performed with a low pressure application, introducing the liquid-phase reducing agent is preferable even in the hydrogen atmosphere.

Further, followings are also disclosed.
21. A method of implementing an electronic part, said electronic part, comprising:
one or more connection terminals set up in a circuit board; and
one or more electrode terminals set up in an electronic member, wherein
said one or more electrode terminals are electrically bonded to said one or more connection terminals via a bonding layer,
surfaces of at least either of said connection terminals and said electrode terminals being constituted with a silver-oxide layer,
said electronic-part implementing method, comprising a step of:
establishing an electrical bonding between said connection terminals and said electrode terminals by
supplying a reducing agent to said silver-oxide layer, and imparting at least a 100-° C. to 400-° C. heat application to said bonding surface, and
imparting at least a 0.1-MPa to 20-MPa pressure application to said bonding surface when said silver oxide is reduced to metallic silver.
22. The electronic-part implementing method according to 21, wherein said reducing agent is a carboxylic-acid species, an alcohol species, or an amine species.
23. The electronic-part implementing method according to 21, further comprising a step of:
supplying said reducing agent only to said bonding surface of said electronic member, and leaving said silver-oxide layer other than said bonding surface as it is.
24. A method of implementing an electronic part, said electronic part, comprising:
one or more connection terminals set up in a circuit board; and
one or more electrode terminals set up in an electronic member, wherein
said one or more electrode terminals are electrically bonded to said one or more connection terminals via a bonding layer,
surfaces of at least either of said connection terminals and said electrode terminals being constituted with a silver-oxide layer,
said electronic-part implementing method, comprising a step of:
establishing an electrical bonding between said connection terminals and said electrode terminals by
imparting at least a 100-° C. to 400-° C. heat application to said bonding surface in a reducing-gas atmosphere, and
imparting at least a 0.1-MPa to 20-MPa pressure application to said bonding surface when said silver oxide is reduced to metallic silver.
25. The electronic-part implementing method according to 24, further comprising a step of:
supplying a reducing agent to said silver-oxide layer, and applying an oxidization processing to said silver-oxide layer.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:
1. An electronic part, comprising:
one or more connection terminals set up in a circuit board; and
one or more electrode terminals set up in an electronic member, wherein
said one or more electrode terminals are electrically bonded to said one or more connection terminals via a bonding layer,
said bonding layer being mainly composed of sintered silver whose crystalline particle diameter is smaller than 1000 nm, entire or a partial surface of said electrode surface being a coarsely-grained layer of metallic silver or silver oxide, said electrode surface being in no contact with said bonding layer.

2. The electronic part according to claim 1, wherein
a resin is charged into between said circuit board and said electronic member,
said entire or said partial surface of said electrode surface being bonded to said resin via said coarsely-grained layer of metallic silver or silver oxide, said electrode surface being in no contact with said bonding layer.

3. The electronic part according to claim 1, wherein
said sintered silver is porous, a resin being charged into pores of said sintered silver.

4. The electronic part according to claim 1, wherein
said connection terminals or said electrodes are composed of at least one material which is selected from a simple substance, an alloy, or a mixture of Ag, Au, Cu, Pt, Ni, Co, Ti, Mo, Fe, Al, Zn.

5. The electronic part according to claim 1, wherein
said connection terminals or said electrodes are composed of at least one material which is selected from a simple substance of Sn, a Sn alloy, or a Sn mixture.

6. The electronic part according to claim 1, wherein
bumps exist at said bonding portion of said electrodes and said connection terminals.

* * * * *